United States Patent
Mueller

(10) Patent No.: US 8,141,834 B2
(45) Date of Patent: Mar. 27, 2012

(54) TEST HEAD POSITIONING SYSTEM

(75) Inventor: Christian Mueller, Rosenheim (DE)

(73) Assignee: inTEST Corporation, Cherry Hill, NJ (US)

( * ) Notice: Subject to any disclaimer, the term of this patent is extended or adjusted under 35 U.S.C. 154(b) by 1643 days.

(21) Appl. No.: 10/567,201

(22) PCT Filed: Aug. 3, 2004

(86) PCT No.: PCT/US2004/025172
§ 371 (c)(1),
(2), (4) Date: Feb. 28, 2006

(87) PCT Pub. No.: WO2005/015245
PCT Pub. Date: Feb. 17, 2005

(65) Prior Publication Data
US 2006/0177298 A1    Aug. 10, 2006

Related U.S. Application Data

(60) Provisional application No. 60/492,849, filed on Aug. 6, 2003.

(51) Int. Cl.
*E04G 3/00* (2006.01)
(52) U.S. Cl. .................................................. 248/278.1
(58) Field of Classification Search ............... 248/276.1, 248/280.11, 281.11, 278.1, 279.1
See application file for complete search history.

(56) References Cited

U.S. PATENT DOCUMENTS

| | | |
|---|---|---|
| 3,259,351 A | 7/1966 | Olsen |
| 3,880,393 A | 4/1975 | Watson |
| 4,449,884 A | 5/1984 | Motoda |
| 4,527,942 A * | 7/1985 | Smith ........................... 414/590 |
| 4,588,346 A * | 5/1986 | Smith ........................... 414/673 |
| 4,695,024 A | 9/1987 | Haven |
| 5,149,029 A | 9/1992 | Smith |
| 5,390,104 A | 2/1995 | Fulton |
| 5,456,130 A | 10/1995 | Pierson et al. |
| 5,538,389 A | 7/1996 | Stone |
| 6,105,909 A * | 8/2000 | Wirth et al. ................. 248/123.2 |
| 6,396,257 B1 | 5/2002 | Baker et al. |
| 6,448,797 B1 | 9/2002 | Holt et al. |
| 6,471,165 B2 * | 10/2002 | Twisselmann ........... 248/123.11 |
| 6,543,914 B2 * | 4/2003 | Sander .......................... 362/401 |
| 6,550,734 B1 * | 4/2003 | Spadea ..................... 248/280.11 |
| 2003/0080269 A1 * | 5/2003 | Oddsen, Jr. ................. 248/274.1 |

FOREIGN PATENT DOCUMENTS

| | | |
|---|---|---|
| DE | 197 23 720 | 12/1998 |
| DE | 102 30 021 | 7/2003 |
| FR | 2 806 025 | 9/2001 |
| WO | WO 02/25292 A | 3/2002 |

OTHER PUBLICATIONS

European Search Report for Application No. EP 08 15 3519 dated Jun. 17, 2008. Australian Patent Office Search Report for Application No. SG 200600696-9 dated May 29, 2007.

* cited by examiner

*Primary Examiner* — Ramon Ramirez
(74) *Attorney, Agent, or Firm* — RatnerPrestia

(57) ABSTRACT

An apparatus (1) for manipulating a load includes a first support structure (60) for supporting the load and a second support structure (4) for supporting the load. The apparatus also includes a coupling (3) coupled between the first support structure (60) and the second support structure (4). The coupling (30) includes a compliant mechanism (340a) for providing a compliant range of motion to the load about a rotative axis where a center of gravity of the load is located away from the rotative axis. The rotative axis is a non-vertical axis.

52 Claims, 36 Drawing Sheets

SECTION B-B

Section A-A

TEST HEAD POSITIONING SYSTEM

This Application is a U.S. National Phase Application of PCT International Application PCT/US2004/025172 which claims priority based on U.S. Provisional Application 60/492,849, filed Aug. 6, 2003.

FIELD OF THE INVENTION

The present invention relates to systems for positioning and manipulating loads, and more particularly, to systems for positioning and manipulating test heads.

BACKGROUND OF THE INVENTION

Test heads are often utilized in the testing of integrated circuits. In order to use a test head to test integrated circuits, the test head is typically "docked" to a piece of peripheral equipment such as a prober or a device handler (hereinafter "peripheral"). A test head manipulator is typically used to position and manipulate the test head during the docking operation.

In docking a test head to a peripheral, it is desirable that the test head be moveable in a number of directions (i.e., that the test head have a number of degrees of freedom). Further, it is, also desirable to have the test head be compliantly moveable with respect to various degrees of freedom (i.e., the test head is substantially weightless or may be moved with a relatively small amount of externally applied force with respect to each of the degrees of freedom).

As a test head is moved through space, both its displacement and angular orientation with respect to the manipulator changes. For the purposes of describing the present invention, it is convenient to define two rectangular coordinate systems, one coordinate system attached to the test head and one coordinate system attached to the manipulator.

FIG. 1 depicts test head 150 having mutually orthogonal coordinate axes I 102, J 104, and K 106 attached thereto. Thus, this set of axes moves through space with the test head. Test site 160 is located on a surface of test head 150 and it includes electrical contacts which are to be placed in contact with the device under test ("dut"). The J axis 104 is shown orthogonal to and directed in a positive direction away from the test site surface. Rotation about I 102 is generally referred to as "pitch," "tumble," or "nod." Rotation about K 106 is generally referred to as "roll." Rotation about J 104 is generally referred to in the industry as "theta." Briefly, when the test head is docked, peripheral test site 160 is desirably aligned with a corresponding site on the peripheral. Generally, with test head 150 slightly away from the peripheral, test head 150 is first aligned in five degrees of freedom including I, K displacements, pitch and roll rotations (establishes planarity) and theta rotation. Test head 150 is then maneuvered in the J direction until the test contacts are properly engaged; whereupon it is docked. Often, precise alignment features are provided to achieve a precise final alignment as test head 150 is maneuvered into a final docked position. Thus, it is generally desirable to enable the test head to be maneuvered simultaneously in six degrees of freedom for docking.

FIG. 2 illustrates a set of mutually orthogonal coordinate axes 200 useful for describing motions of the manipulator. This set of coordinate axes is fixed to the manipulator and thus fixed in space. X-axis 202 illustrates a linear side-to-side direction. Likewise, Y-axis 204 illustrates a linear up-down or vertical direction along which a test head is desirably moveable, and Z-axis 206 illustrates a linear in-out direction along which the test head is desirably moveable. Rotations about these three axes are referred to, for purposes of this application, as "U," "V," and "W" respectively.

If a test head can move (in conjunction with the test head manipulator) along and rotate about each of X-axis 202, Y-axis 204, and Z-axis 206, the manipulator is said to provide at least six (6) degrees of freedom. If a test head can be moved compliantly, both linearly and rotationally, with respect to its axes I 102, J 104, and K 106 then the test head is said to be compliant with six (6) degrees of freedom.

Because test heads are typically very expensive, it is often desirable to use the same test head to dock with various different peripherals. For example, the same test head may be used to dock in a horizontal plane (i.e., with J 104 vertical) with a device handler (e.g., a test head may dock with a device handler from below the device handler) and a prober (e.g., a test head may dock with a prober from above the prober). In order to dock with various different types of peripherals, a test head manipulator desirably has a long vertical stroke (e.g., a long vertical range of motion). However, because of size constraints on test heads and the associated manipulators, this is not always practical. Additionally, certain test head manipulator systems utilize pneumatic cylinders to position and manipulate test heads in the vertical direction. In such a design, the vertical stroke provided by the test head manipulator is limited by the stroke of the pneumatic cylinder arrangement. Often, with larger test heads, the stroke of a pneumatic cylinder arrangement is inadequate to provide a vertical range of motion adequate for docking a test head with the different types of peripherals.

In other instances it may be required to dock with a peripheral where test site 160 is in a vertical plane. In such a case, test head 150 must be rolled 90 degrees from the horizontal so that J 104 axis is in a horizontal plane. Then, theta rotation occurs in a vertical plane. With respect to the fixed manipulator axes 200, it is common for such vertical plane docking to be required in either the XY plane or the YZ plane. Other vertical planes and arbitrarily angled planes are of course also possible.

Another problem that arises when trying to dock a test head with different types of peripherals is that during manipulation of the test head, a degree of freedom may be lost. For example, in certain configurations where a test head is in a position where its J 104 axis is parallel to the X-axis of the manipulator (i.e., when docking in the YZ plane), the theta degree of compliant freedom may be lost.

Conventional attempts at alleviating such a lost degree of freedom have resulted in increasingly complex and expensive manipulator systems. For example, Holt at U.S. Pat. No. 5,450,766 and Slocum at U.S. Pat. No. 5,931,048 show apparatuses which avoid the aforementioned situation.

As provided above, in systems for the docking of a test head, it is sometimes desirable to provide complaint motion in each of the test head's six (6) degrees of freedom. This means that during docking, a test head manipulator desirably balances the test head in a substantially weightless condition in each of the these six (6) degrees of freedom such that an operator can move the test head manually in each of the directions with relatively little force. However, as test heads have become larger and heavier, the physical force required to manually manipulate the test head in certain directions (even in a compliant state) may be difficult if not impossible for certain operators to provide.

As such, it would be desirable to provide a test head positioning and manipulation system addressing the above recited deficiencies.

SUMMARY OF THE INVENTION

In an exemplary embodiment of the present invention, an apparatus for manipulating a load is provided. The apparatus includes a first support structure for supporting the load and a second support structure for supporting the load. The apparatus also includes a coupling coupled between the first support structure and the second support structure. The coupling includes a compliant mechanism for providing a compliant range of motion to the load about a rotative axis where a center of gravity of the load is located away from the rotative axis. The rotative axis is a non-vertical axis.

According to another exemplary embodiment of the present invention, a method of manipulating a load is provided. The method includes providing a first support structure for supporting the load. The method also includes rotatively coupling the first support structure to a second support structure for supporting the load about a rotative axis such that a center of gravity of the load is located away from the rotative axis, the rotative axis being a non-vertical axis. The method also includes providing a compliant range of motion to the load about the rotative axis. The method also includes manipulating the load about the rotative axis using the compliant range of motion.

According to yet another exemplary embodiment of the present invention, an apparatus for manipulating a load is provided. The apparatus includes a first support structure for supporting the load. The first support structure provides the load with a first substantially vertical range of motion. The apparatus also includes a second support structure for supporting the load. The second support structure provides the load with a second substantially vertical range of motion relative to the first substantially vertical range of motion. The apparatus also includes a coupling between the first support structure and the second support structure. The coupling provides at least one additional range of motion to the load in a direction or about an axis. The additional range of motion is not in a substantially vertical direction.

According to yet another exemplary embodiment of the present invention, a method of manipulating a load is provided. The method includes moving the load to a first position within a first substantially vertical range of motion of the load. The first substantially vertical range of motion is provided by a first support structure. The method also includes moving the load to a second position within a second substantially vertical range of motion of the load relative to the first substantially vertical range of motion. The second substantially vertical range of motion is provided by a second support structure. The method also includes providing a coupling between the first support structure and the second support structure. The coupling provides an additional range of motion to the load in a direction or about an axis. The additional range of motion is not in a substantially vertical direction.

According to yet another exemplary embodiment of the present invention, an apparatus for remotely changing a position of a regulating control device is provided. The regulating control device regulates a force for at least partially supporting a load. The apparatus includes a remote unit for varying a fluid pressure. The variation in fluid pressure corresponds to a change in the position of the regulating control device in at least one direction. The apparatus also includes a coupling coupled between the remote unit and the regulating control device. The coupling is configured to change the position of the regulating control device based on the variation in fluid pressure. The apparatus also includes a fluid carrier for providing the change in fluid pressure from the remote unit to the coupling.

According to yet another exemplary embodiment of the present invention, a method of remotely changing the position of a regulating control device is provided. The regulating control device regulates a force for at least partially supporting a load. The method includes varying a fluid pressure, via a remote unit, where the variation in fluid pressure corresponds to a change in the position of the regulating control device in at least one direction. The method also includes providing the change in fluid pressure, via a fluid carrier, from the remote unit to a coupling coupled between the remote unit and the regulating control device. The method also includes changing the position of the regulating control device through the coupling based on the variation in fluid pressure.

According to yet another exemplary embodiment of the present invention, an apparatus for manipulating a load is provided. The apparatus includes a support structure for supporting the load. The support structure provides the load with a range of motion, where the range of motion is a compliant range of motion. The apparatus also includes a remote unit for adjusting a fluid pressure of a fluid system through a fluid carrier. The fluid system provides at least a portion of the force for supporting the load within the compliant range of motion. An adjustment of the fluid pressure via the remote unit adjusts the force for supporting the load. For example, the fluid pressure may be adjusted to balance the load in a substantially weightless condition within the compliant range of motion. Alternatively, the fluid pressure may be adjusted to adjust a position of the load within the compliant range of motion.

According to yet another exemplary embodiment of the present invention, a method of manipulating a load is provided. The method includes providing a support structure for supporting the load. The support structure provides the load with a compliant range of motion. The method also includes varying a fluid pressure through a fluid carrier, via a remote unit, where the fluid pressure provides at least a portion of a force for supporting the load within the compliant range of motion. For example, the fluid pressure may be varied in order to balance the load in a substantially weightless condition within the compliant range of motion. Alternatively, the fluid pressure may be varied in order to adjust a position of the load within the compliant range of motion.

According to yet another exemplary embodiment of the present invention, a method of manipulating a load is provided. The method includes at least partially supporting the load in a compliant state in a direction or about an axis by pressurizing a fluid, such that the load may be moved in the direction or about the axis using a first manual amount of force. The method also includes remotely adjusting the fluid pressure such that the load may be moved in the direction or about the axis using a second manual amount of force until an operator can manipulate the load in the direction or about the axis. The second manual amount of force is less than the first manual amount of force.

BRIEF DESCRIPTION OF THE DRAWINGS

Exemplary embodiments of the invention will be described with reference to the drawings, of which.

DETAILED DESCRIPTION OF THE INVENTION

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Figure 1:
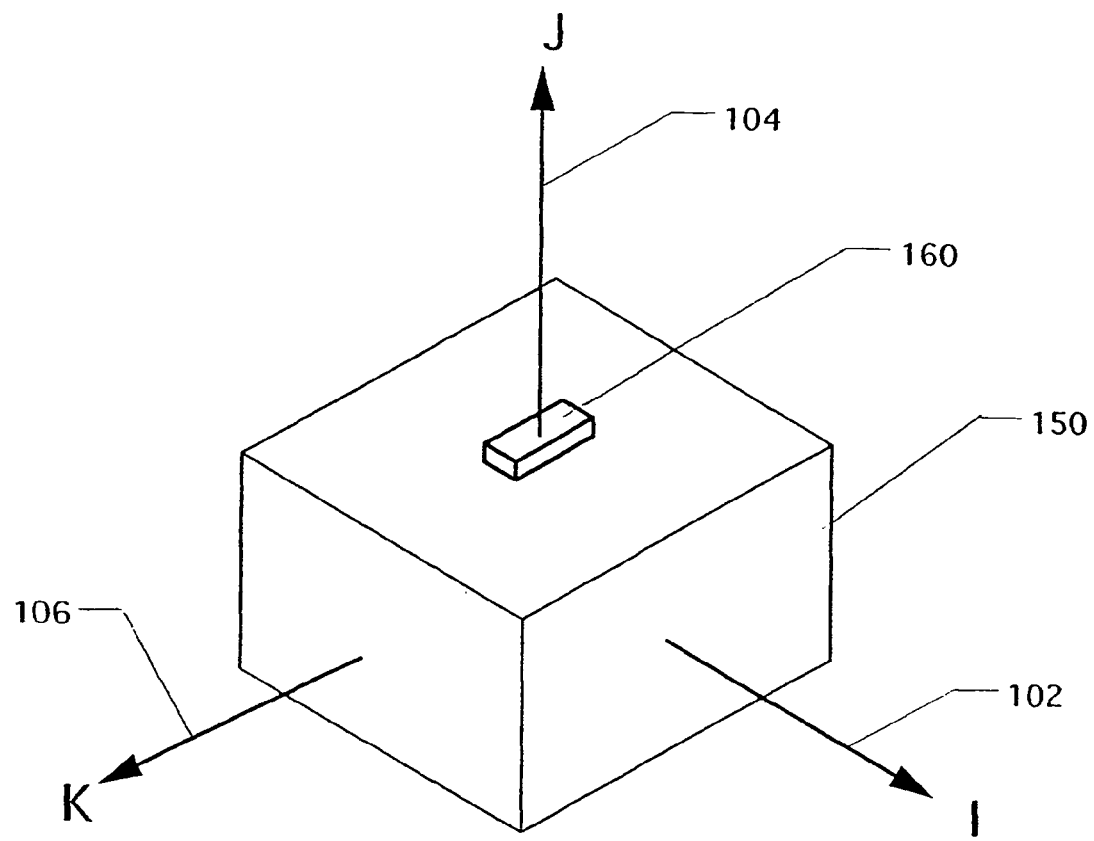
FIG. 1 is a perspective view of a test head and a first coordinate system attached thereto.
Figure 2:
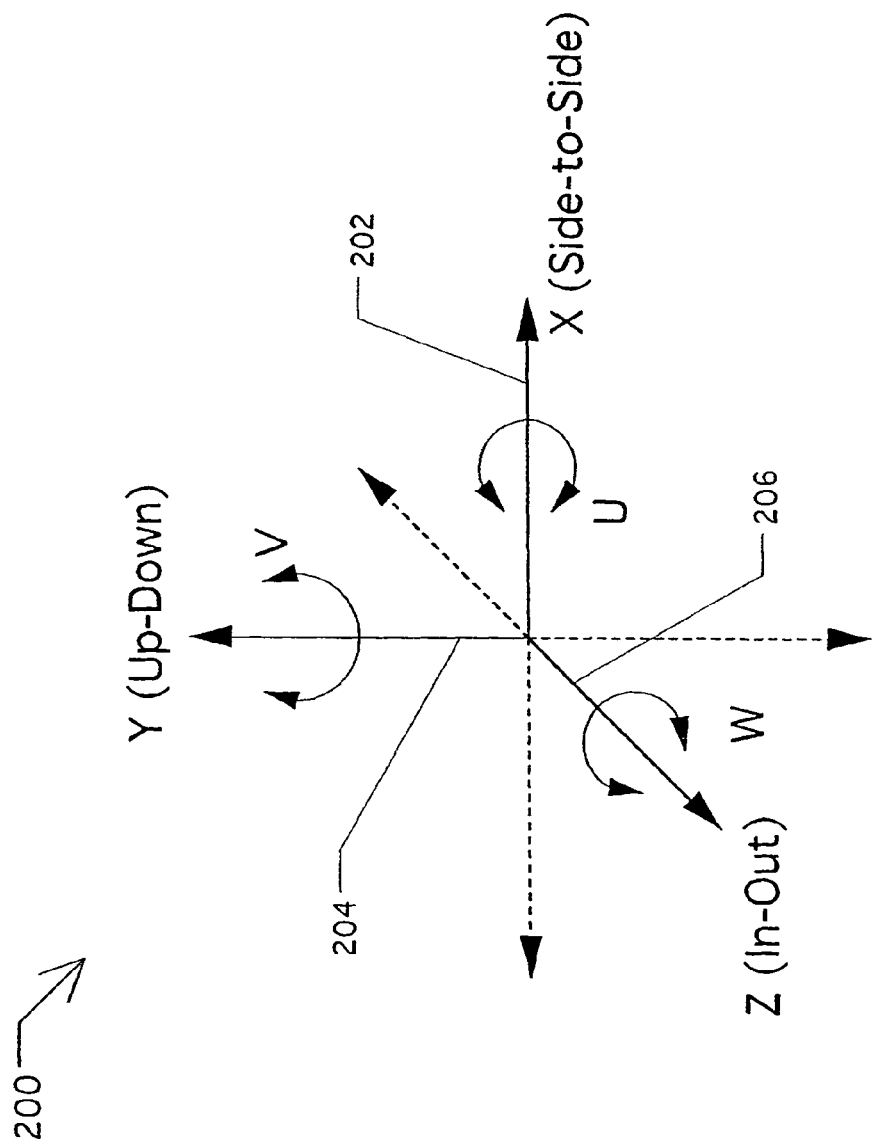
FIG. 2 is a perspective view of a second coordinate system useful in illustrating various exemplary embodiments of the present invention.
Figure 3:
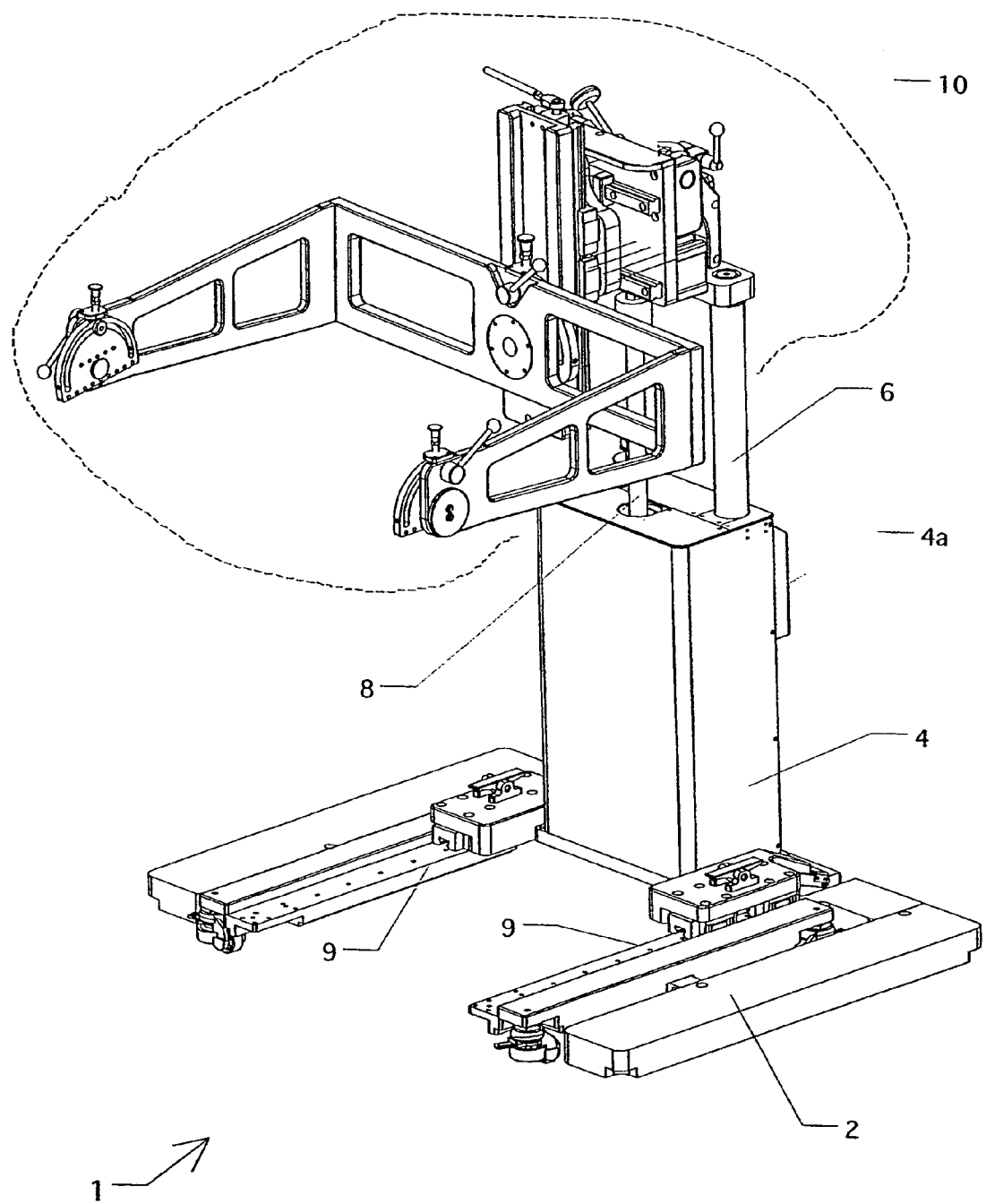
FIG. 3 is a perspective view of a test head manipulator in accordance with an exemplary embodiment of the present invention.

FIG. 3 is a perspective view of test head manipulator 1. Test head manipulator 1 includes base 2, vertical column unit 4, control enclosure 4a, test head attachment unit 10, guide rails 6 (only one guide rail 6 is visible in FIG. 3) that extend between column unit 4 and test head attachment unit 10, and piston rod 8 also extending between column unit 4 and test head attachment unit 10. Piston rod 8 extends from a "main vertical pneumatic cylinder" contained within column unit 4, and it provides a vertical range of motion for test head attachment unit 10. Thus, manipulator 1 may be of the fluid-balanced type described by Smith, first at U.S. Pat. No. 4,589,815 (See, e.g., FIGS. 9 through 12), and subsequently at U.S. Pat. Nos. 4,705,447 and 5,149,029. These three patents are herein incorporated by reference in their entirety. As described in these patents, a substantially weightless condition (thus compliant motion) is provided in the vertical or Y axis 204.

It is seen that column unit 4 supports test head attachment unit 10 which in turn supports a test head (not shown in FIG. 3), such as test head 150. Column unit 4 is movable in an in-out or Z axis 206 direction with respect to base 2 by means of linear rails 9 and low friction linear bearings in a well known manner. Thus, compliant Z axis 206 motion is provided.

Figure 4:
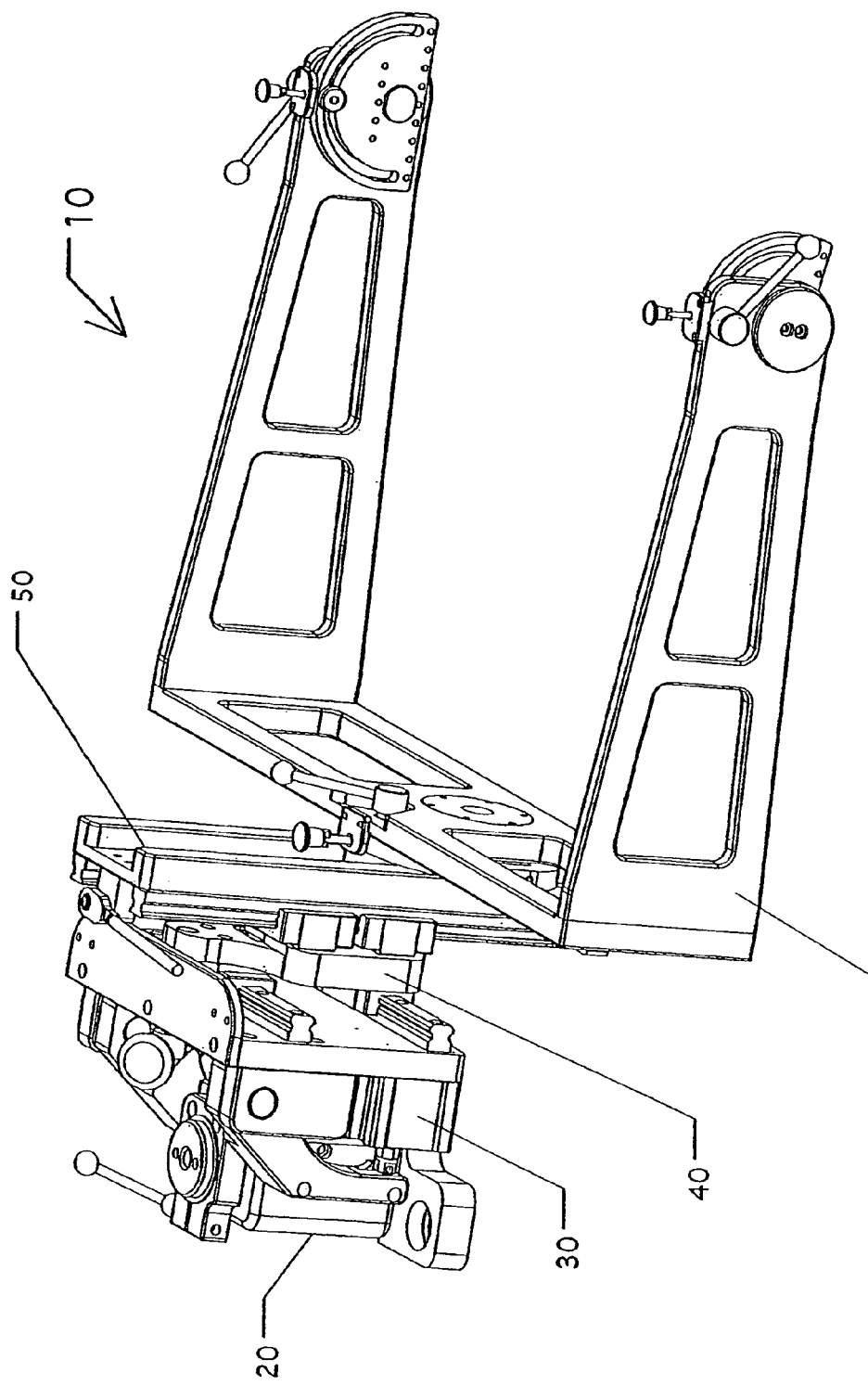
FIG. 4 is a perspective view of a test head attachment unit in accordance with an exemplary embodiment of the present invention.

FIG. 4 is a perspective view of test head attachment unit 10. Test head attachment unit 10 includes various subsystems and subassemblies that provide support, a range of motion, and/or compliant motion in at least one of a number of degrees of freedom. These subsystems/subassemblies include swing unit subassembly 20, theta compliance carrier 30, X-carrier subassembly 40, vertical carrier subassembly 50, and cradle subassembly 60. A test head (not shown in FIG. 4) is coupled to or engaged with cradle subassembly 60.

A brief description of the motions provided by each subassembly is now presented. As provided above, compliant vertical motion (i.e., Y axis 204 motion) and compliant in-out motion (i.e., Z axis 206 motion) are provided by the combination of the column unit 4 and base 2.

Swing unit assembly 20 is rotatably attached to column unit 4 (which may be considered, for example, to be a first support structure) by means of a vertical pivot shaft, thus providing compliant V rotation about the Y axis 204. When docking in a horizontal plane (from either above or below) this provides theta compliance. When docking in a vertical plane this provides compliance to assist in planarization.

Theta compliance carrier 30 is attached to swing unit 20 by a horizontal axis. Theta compliance carrier may rotate a few degrees (e.g., plus and minus 2.5 degrees) about a horizontal axis. When docking in a plane where the test head has been rolled 90 degrees from the horizontal, this provides theta compliance. When docking in a horizontal plane this contributes to planarization compliance. When docking in a vertical plane arrived at by rotating the test head 90 degrees from the horizontal about the I (tumble) axis 102 it also contributes to planarization compliance.

X-Carrier subassembly 40 is mounted by means of horizontal rails and linear guide bearings to theta compliance carrier 30. X-Carrier subassembly 40 thus provides compliant linear motion in a horizontal direction. This provides compliant positioning parallel to I axis 102 of test head 150. (In this exemplary configuration two compliant axes of horizontal positioning are provided; however, they are not always orthogonal depending upon the rotational position of swing unit 20. So long as they are not parallel, this is sufficient to provide two linear degrees of freedom in a horizontal plane. Should the swing angle become such that the two axes are parallel, a degree of freedom would be lost.)

Vertical carrier subassembly 50 is attached to X-Carrier subassembly 40 by means of vertically oriented linear rails, a linear guide bearing, and a lead screw. Vertical carrier 50 (which may be considered, for example, to be a second support structure) provides vertical motion. Because vertical compliance is provided in column unit 4 by the main vertical pneumatic cylinder, no compliance has been added to vertical carrier 50 in the described embodiment; however, such an embodiment is contemplated.

Cradle subassembly 60 is pivotably mounted to vertical carrier 50 about a horizontal axis that is orthogonal to the test head's I axis 102. Preferably, the axis is arranged to pass through or near the center of gravity of the test head so that the test head is balanced, or nearly so, with respect to it. Thus, compliant rotation is provided for the test head. When docking either in a horizontal plane or in a vertical plane where the test head is rolled ninety degrees from the horizontal about the K axis 106, this provides a rotational compliance helpful for planarization. When docking in a vertical plane where the test head has been rotated 90 degrees from the horizontal about the I axis 102, this provides compliant theta rotation.

The test head is rotatably attached to cradle 60 about an axis which is parallel to the test head's I axis 102 and which preferably passes through or close to its center of gravity. Thus, the test head is compliantly balanced with respect to this axis. Further, this axis moves with the test head and may be considered a part of it. Rotation about this axis provides compliance in planarization in all docking attitudes. This compliant rotation combined with one of the aforementioned rotations assures that there are two independent rotations necessary for planarizing the test site with the peripheral in all docking attitudes.

Figure 5:
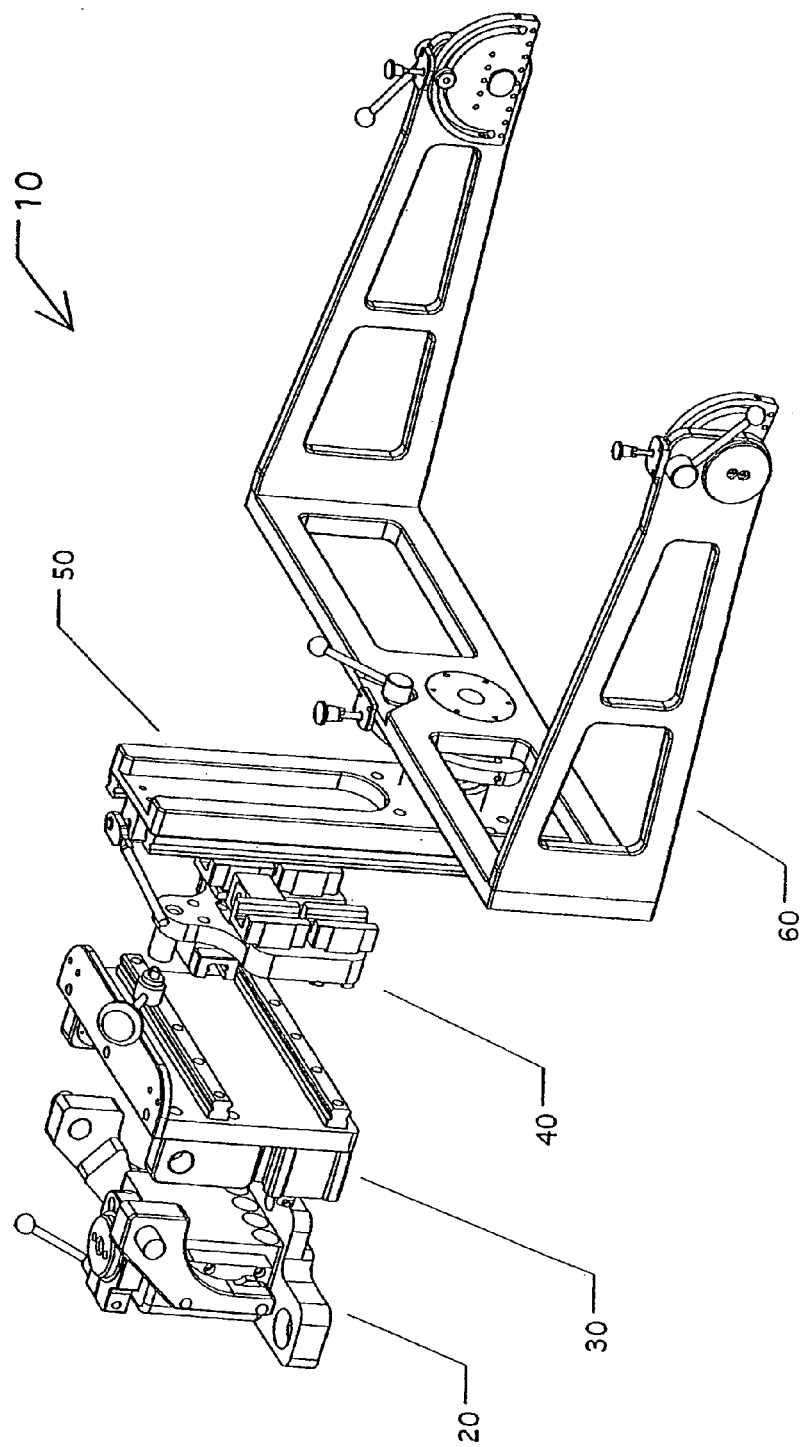
FIG. 5 is a partially exploded perspective view of the test head attachment unit illustrated in FIG. 4.

FIG. 5 is a partially exploded perspective view of test head attachment unit 10 illustrated in FIG. 4. As such, each of swing unit subassembly 20, theta compliance carrier 30, X-carrier subassembly 40, vertical carrier subassembly 50, and cradle subassembly 60 is illustrated in somewhat more detail in FIG. 5.

Figure 6:
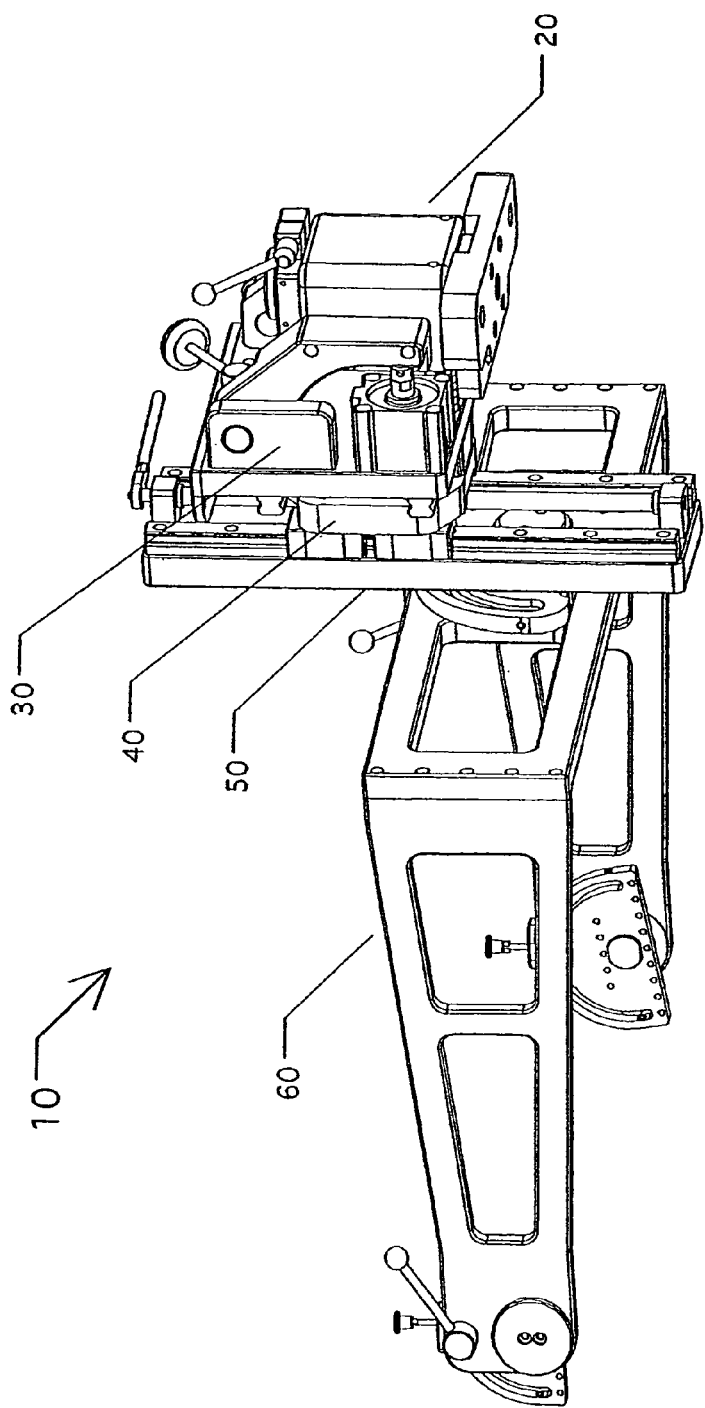
FIG. 6 is a rear perspective view of the test head attachment unit illustrated in FIG. 4.

FIG. 6 is a rear perspective view of test head attachment unit 10 illustrated in FIG. 4. As such, different views of swing unit subassembly 20, theta compliance carrier 30, X-carrier subassembly 40, vertical carrier subassembly 50, and cradle subassembly 60 are illustrated in FIG. 6.

Figure 7:
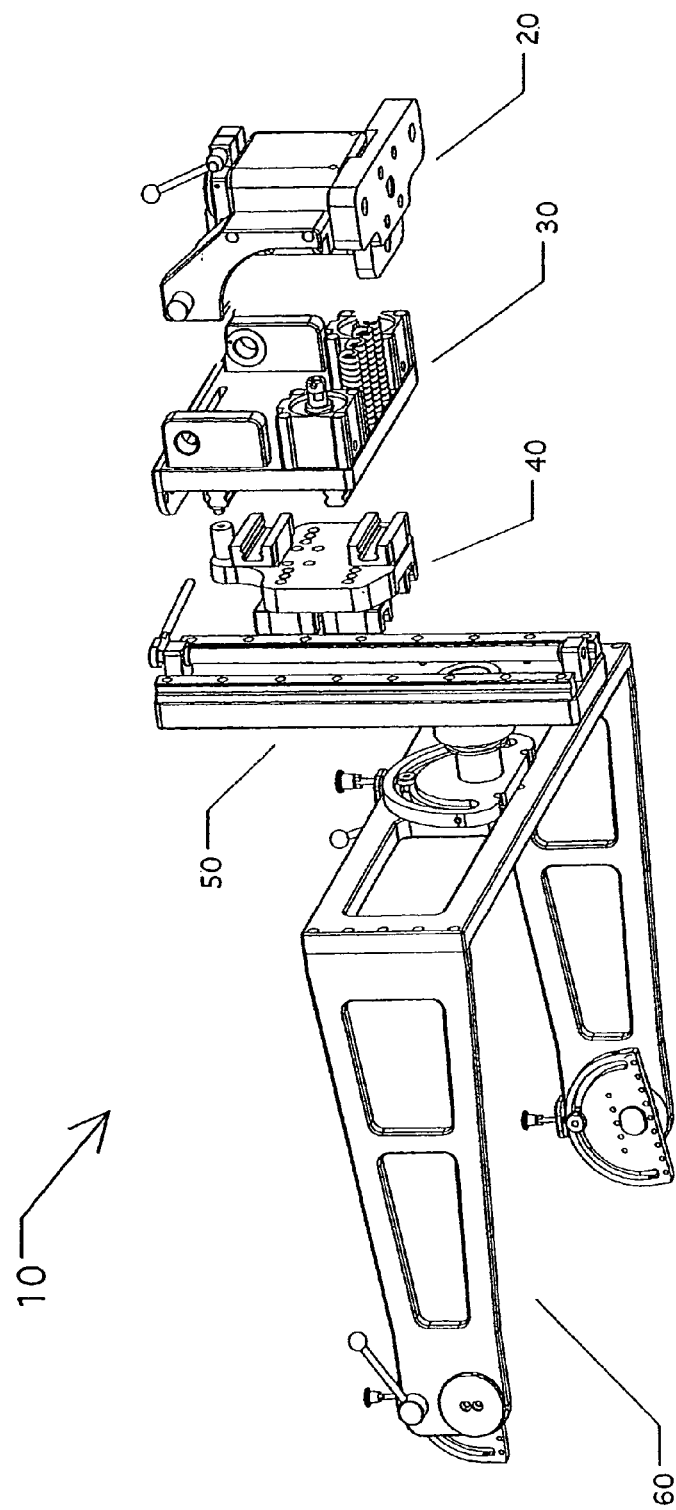
FIG. 7 is a partially exploded rear view of the test head attachment unit illustrated in FIG. 4.

FIG. 7 is an exploded rear perspective view of test head attachment unit 10 illustrating additional details of swing unit subassembly 20, theta compliance carrier 30, X-carrier subassembly 40, vertical carrier subassembly 50, and cradle subassembly 60.

Figure 8:
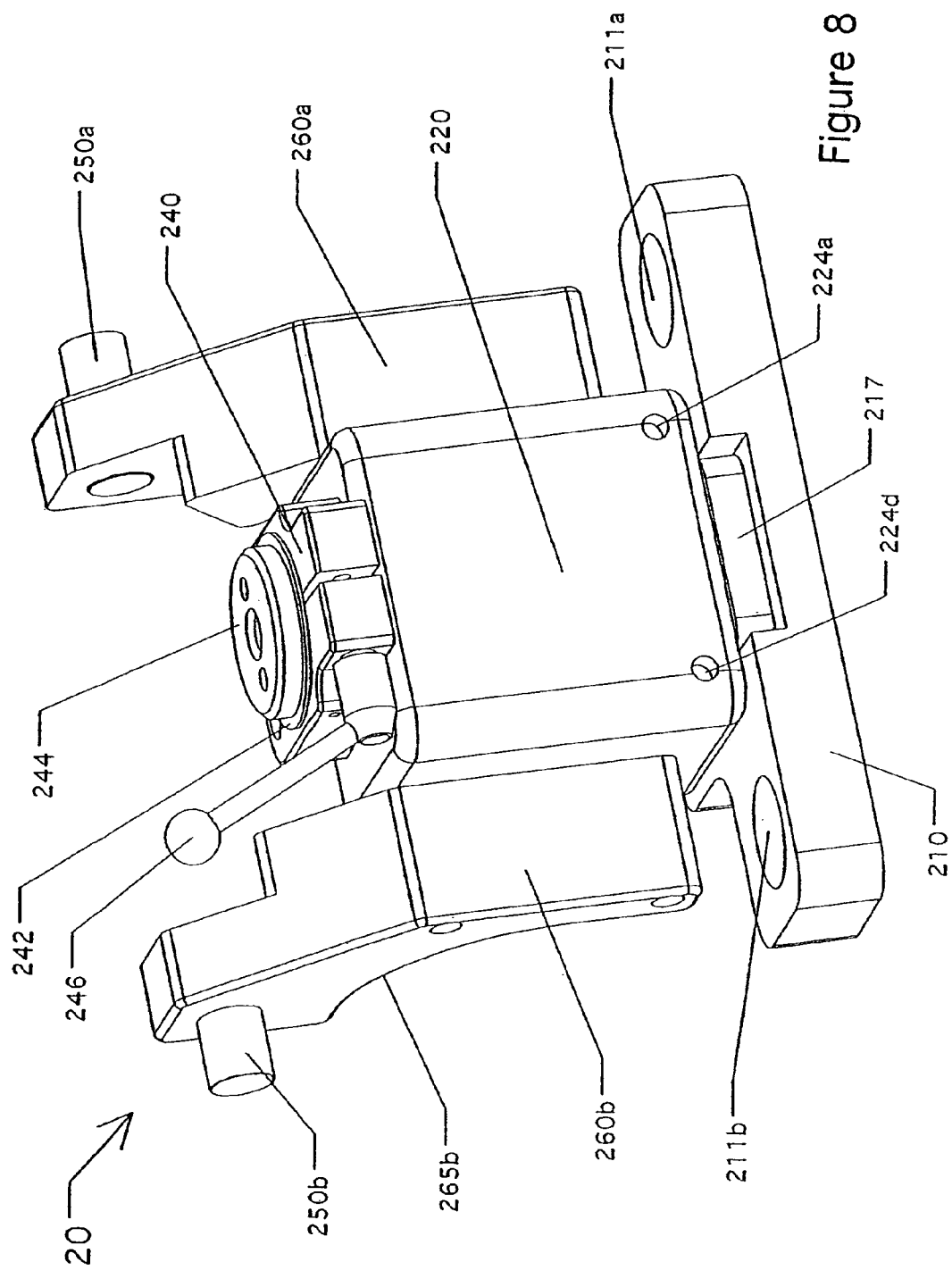
FIG. 8 is a rear perspective view of a swing unit subassembly in accordance with an exemplary embodiment of the present invention.

FIG. 8 is a rear perspective view of swing unit subassembly 20. Swing unit subassembly 20 includes base 210 which defines mounting holes 211a and 211b. As illustrated in FIG. 3, mounting holes 211a and 211b each receive a respective guide rail 6. Swing unit subassembly 20 also includes block 220, lock block 240, theta pivot shafts 250a and 250b, and mounting blocks 260a and 260b. Pivot shafts 250a and 250b are arranged so that they are coaxial and define an axis in the horizontal XZ plane.

Figure 11:
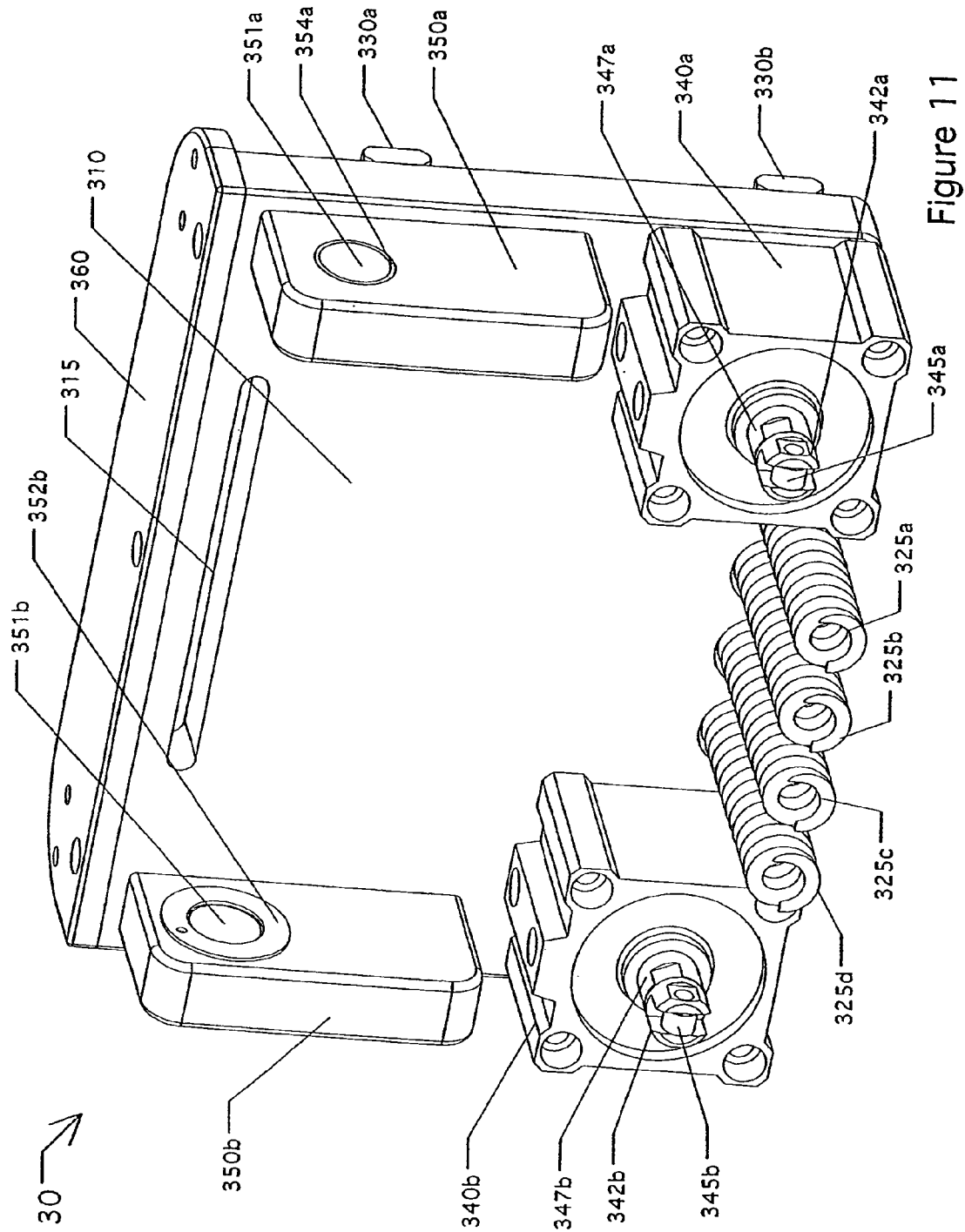
FIG. 11 is a rear perspective view of a theta compliance carrier in accordance with an exemplary embodiment of the present invention.

The locking mechanism of lock block 240 is actuated using lock handle 246. Washer (or bearing) 242 and retaining cap 244 are provided on lock block 240. As illustrated in FIG. 4, theta compliance carrier 30 pivots on theta pivot shafts 250a and 250b. Mounting blocks 260a and 260b define respective curved surfaces 265a and 265b (curved surface 265a is not shown in FIG. 8) on which respective cam followers 345a and 345b ride (cam followers 345a and 345b are illustrated in FIG. 11). Block 220 is rotatively mounted on base 210 via mounting flange 217. Through holes 224a and 224b, defined by block 220, are also visible in FIG. 8.

Figure 9:
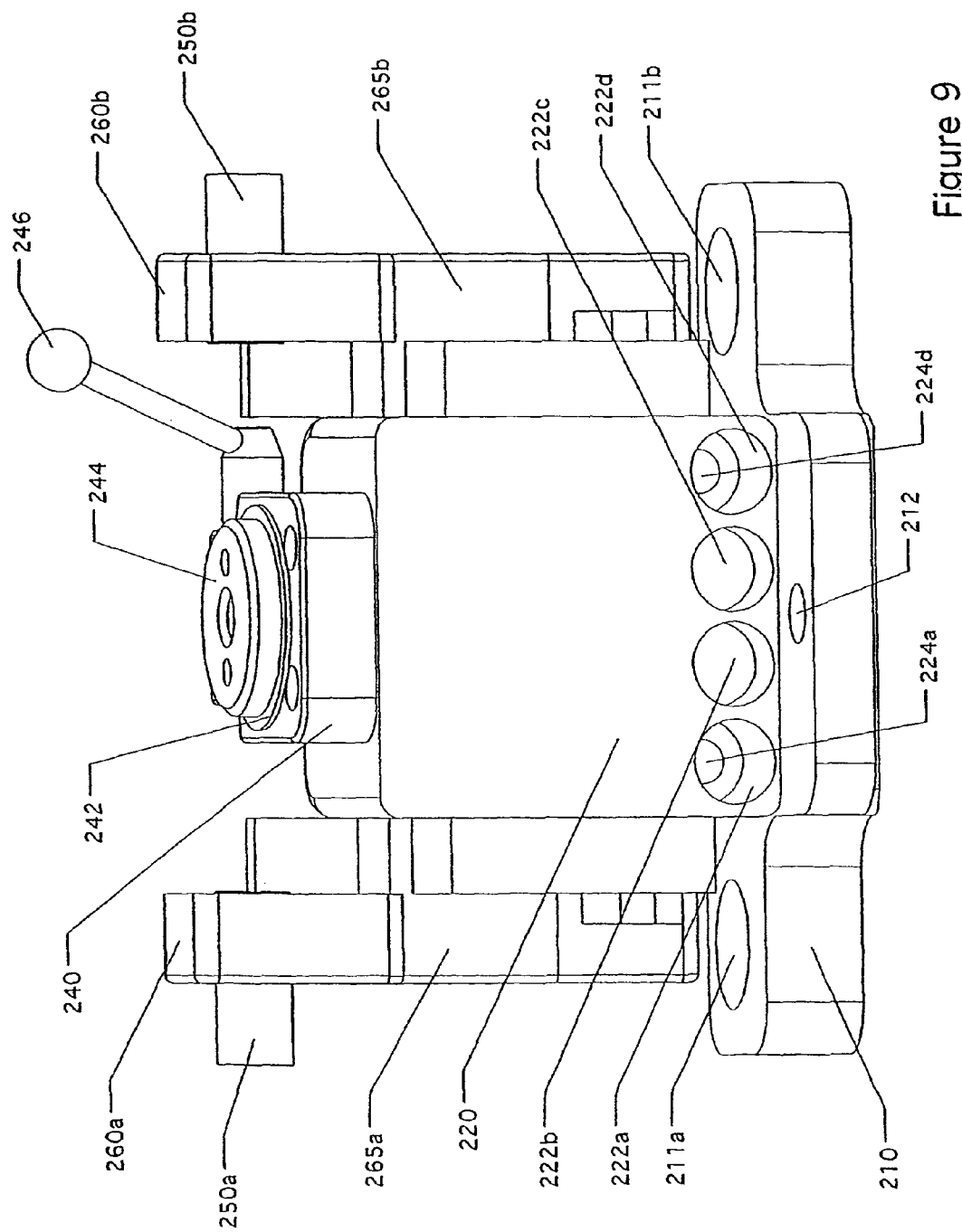
FIG. 9 is a front perspective view of the swing unit subassembly illustrated in FIG. 8.

FIG. 9 is a front perspective view of swing unit subassembly 20. As described above with respect to FIG. 8, swing unit subassembly 20 illustrated in FIG. 9 includes base 210, block 220, lock block 240, washer 242, retaining cap 244, lock handle 246, theta pivot shafts 250a and 250b, mounting blocks 260a and 260b, curved surfaces 265a and 265b, mounting holes 211a and 211b, and through holes 224a and 224d.

As visible in FIG. 9, base 210 also defines mounting hole 2i2 which receives an end portion of piston rod 8 (illustrated in FIG. 3). Block 220 defines spring receiving holes 222a-222d for receiving respective springs 325a-d (illustrated in FIG. 11). Through holes 224a and 224d are used to contain and access set screws used to adjust springs 325a and 325d as will be explained in greater detail below.

Figure 10:
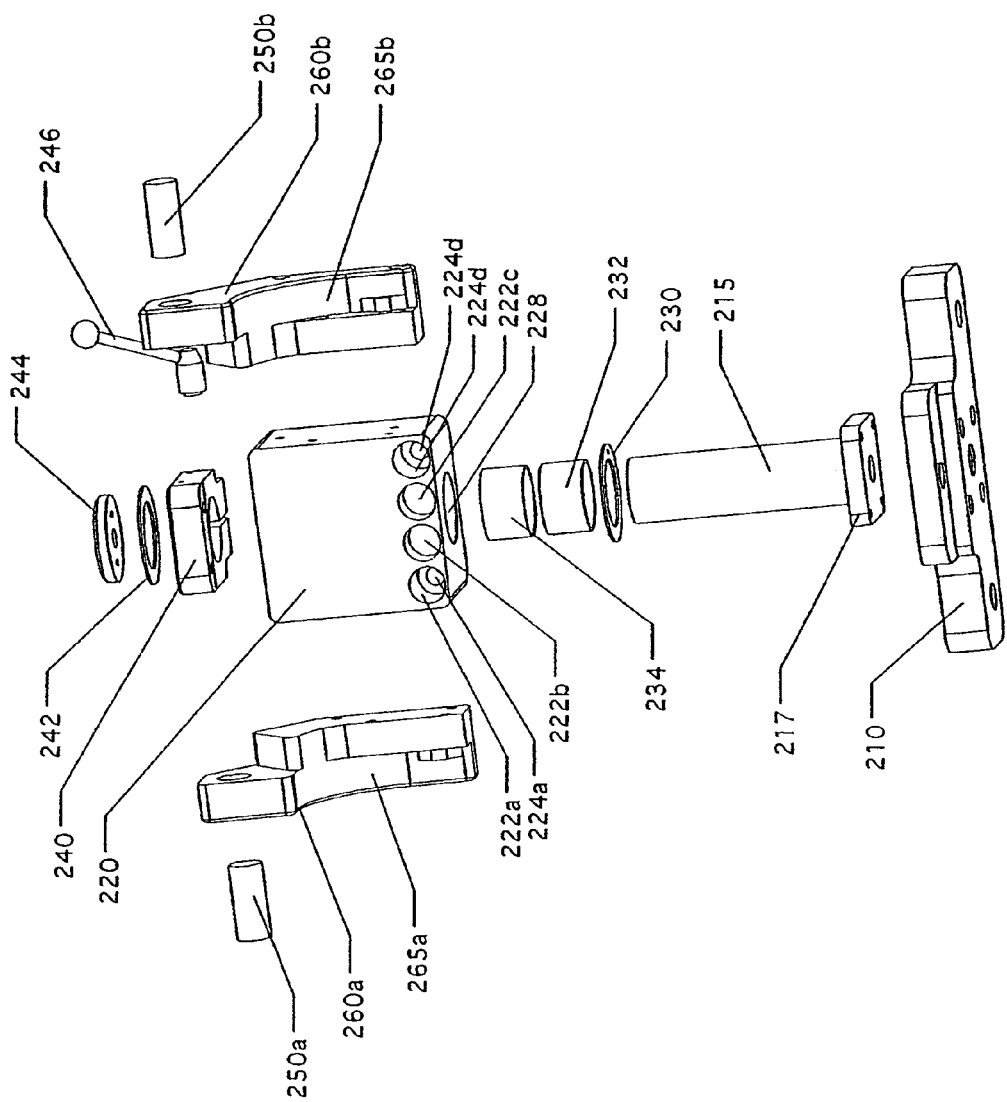
FIG. 10 is an exploded front perspective view of the swing unit subassembly illustrated in FIG. 8.

FIG. 10 is an exploded front view of swing unit subassembly 20. As shown in FIG. 10, shaft 215 extends from mounting flange 217. When assembled, shaft 215 extends through washer (or bearing) 230, bushing (or bearing) 232, bushing (or bearing) 234, and vertical through bore 228 (defined in the bottom of block 220). Vertical through bore 228 extends all the way through block 220, and as such, block 220 rotates upon shaft 215. Thus, shaft 215 serves as an axis for compliant swing motion about a vertical Y axis 204. Bushings 232 and 234 fits inside vertical through bore 228, and facilitate rotation of shaft 215. Retaining cap 244 is held to shaft 215 (e.g., with screws not shown in FIG. 10).

FIG. 11 is a rear perspective view of theta compliance carrier 30. Theta compliance carrier 30 includes mounting plate 310 which defines slot 315. Slot 315, which extends in a horizontal direction, is provided for a horizontal lock. Theta compliance carrier 30 also includes theta pivot blocks 350a and 350b, each of which define a respective theta pivot bore 351a and 351b. Theta pivot shafts 250a and 250b extend through a respective one of theta pivot bores 351a and 351b. When assembled, theta pivot washers (or bearings) 352a and 352b (only theta pivot washer 352b is illustrated in FIG. 11) are positioned between a respective one of theta pivot blocks 350a-b and a corresponding one of mounting blocks 260a-b. Additionally, theta pivots bearings (or bushings) 354a-b are positioned between a respective one of theta pivot bores 351a-b and a corresponding one of theta pivot shafts 250a-b. Thus, theta compliance carrier 30 rotates about the horizontal axis defined by pivot shafts 250a and 250b.

FIG. 11 also illustrates springs 325a-325d, and a portion of linear rails 330a and 330b. Linear rails 330a and 330b provide for horizontal motion. FIG. 11 also illustrates pneumatic cylinders 340a and 340b, including respective holder-adapters 342a and 342b, cam followers 345a and 345b, and piston rods 347a and 347b.

Figure 12:
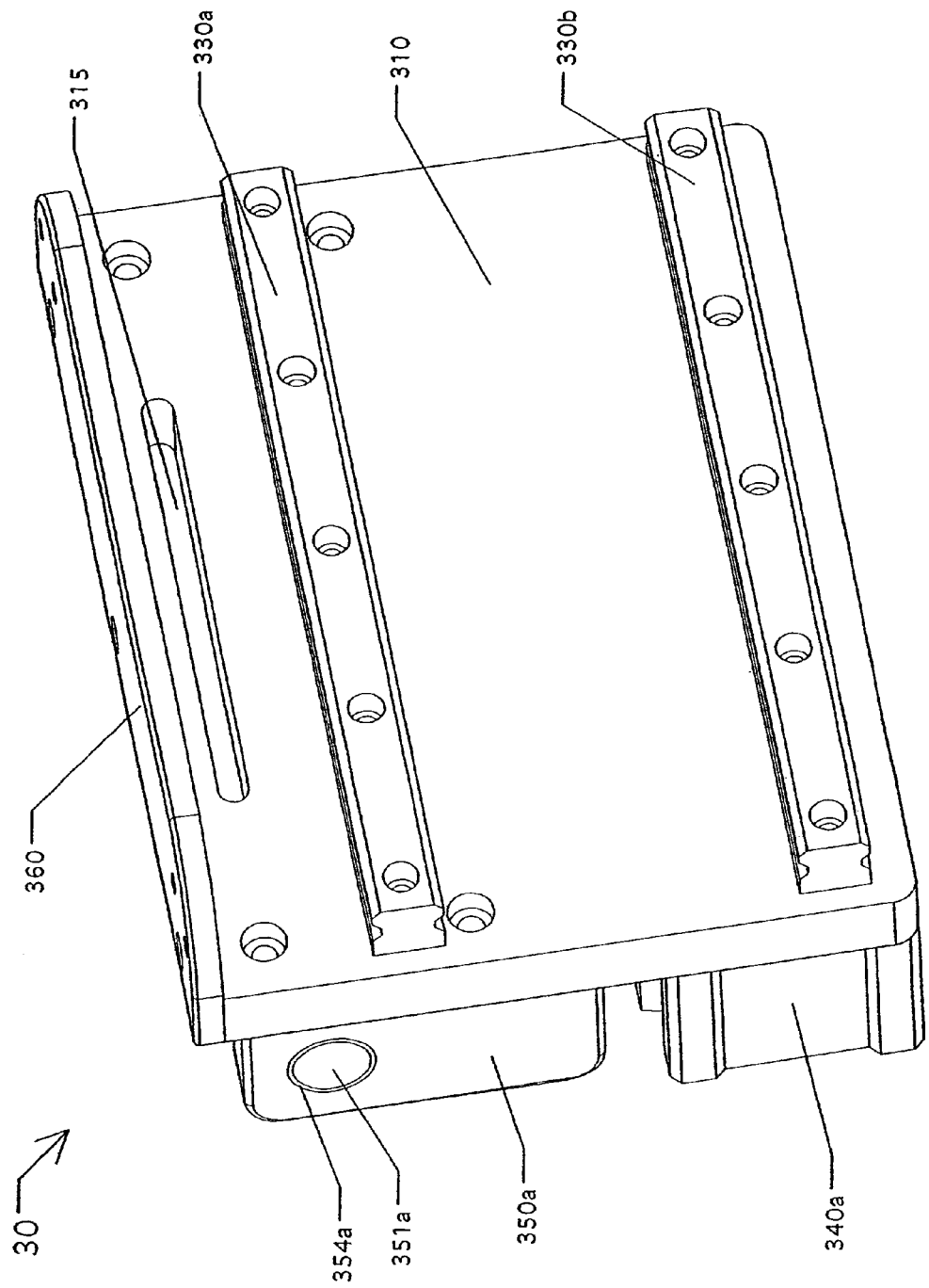
FIG. 12 is a front perspective view of the theta compliance carrier illustrated in FIG. 11.

FIG. 12 is a front perspective view of theta compliance carrier 30 illustrating features similar to those described above with respect to FIG. 11 including mounting plate 310, top plate 360, slot 315, linear rails 330a and 330b, theta pivot bearing 354a, theta pivot bore 351a, theta pivot block 350a, and pneumatic cylinder 340a.

Figure 13:
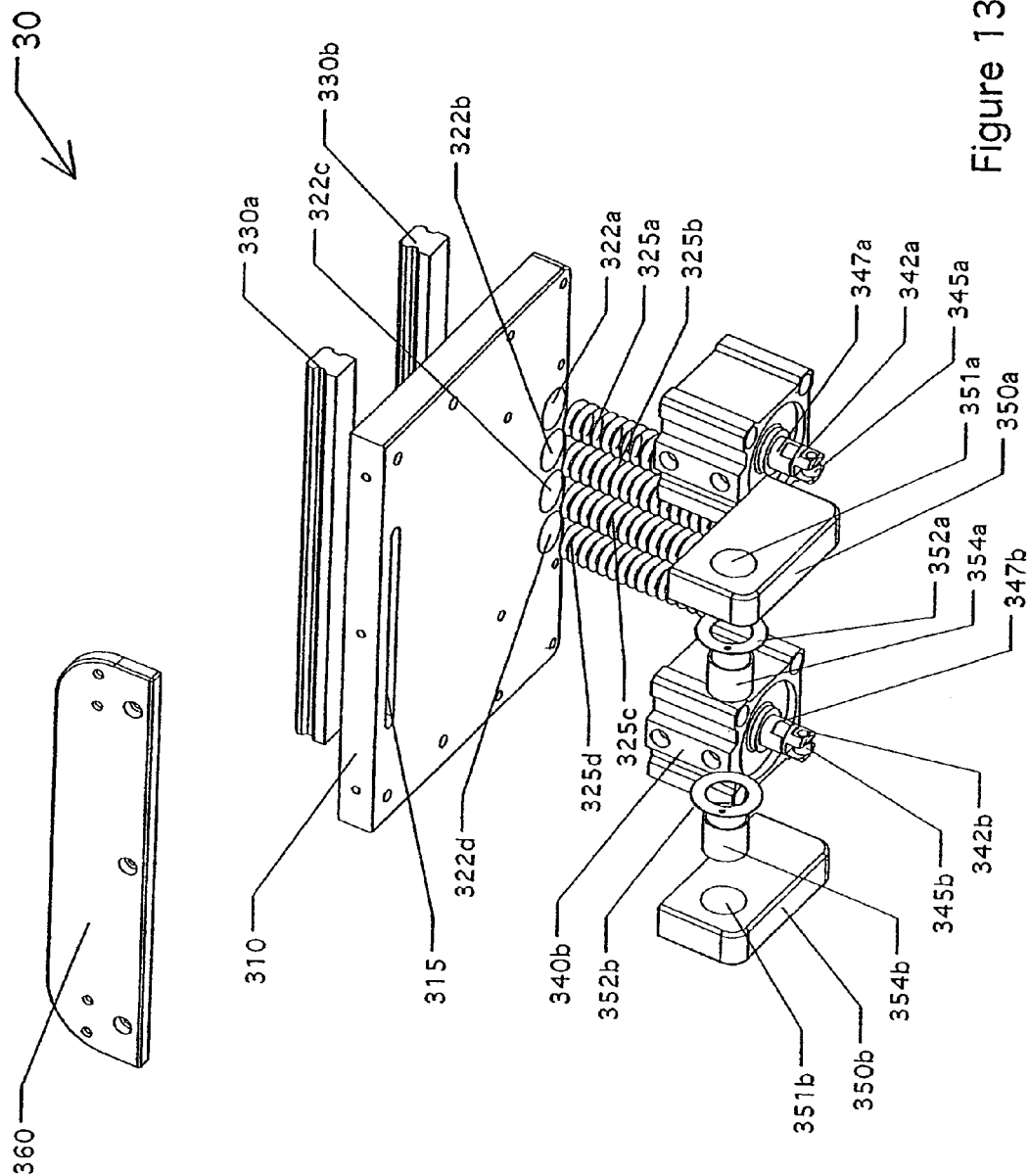
FIG. 13 is an exploded perspective view of the theta compliance carrier illustrated in FIG. 11.
Figure 25:
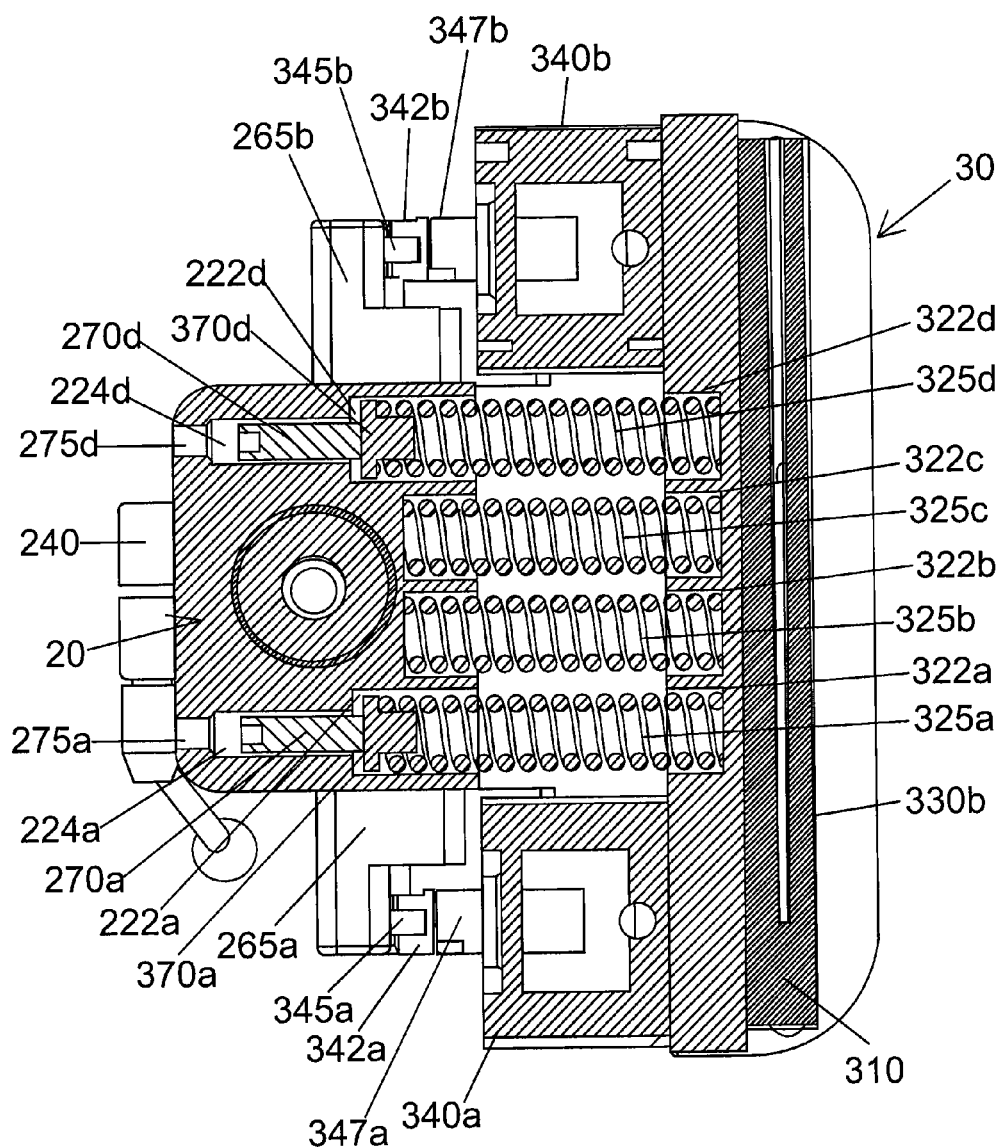
FIG. 25 is a cross-sectional view of FIG. 24 across section B-B.

FIG. 13 is an exploded perspective view of theta compliance unit 30. As shown in FIG. 13, mounting plate 310 defines spring receiving bores 322a-322d for receiving an end portion of a respective one of springs 325a-325d. Note that receiving bores 322a-322d have a depth that is less than the thickness of mounting plate 310 as shown in FIG. 25. Thus, springs 325a-325d bear against the bottom of bores 322a-322d.

Figure 14:
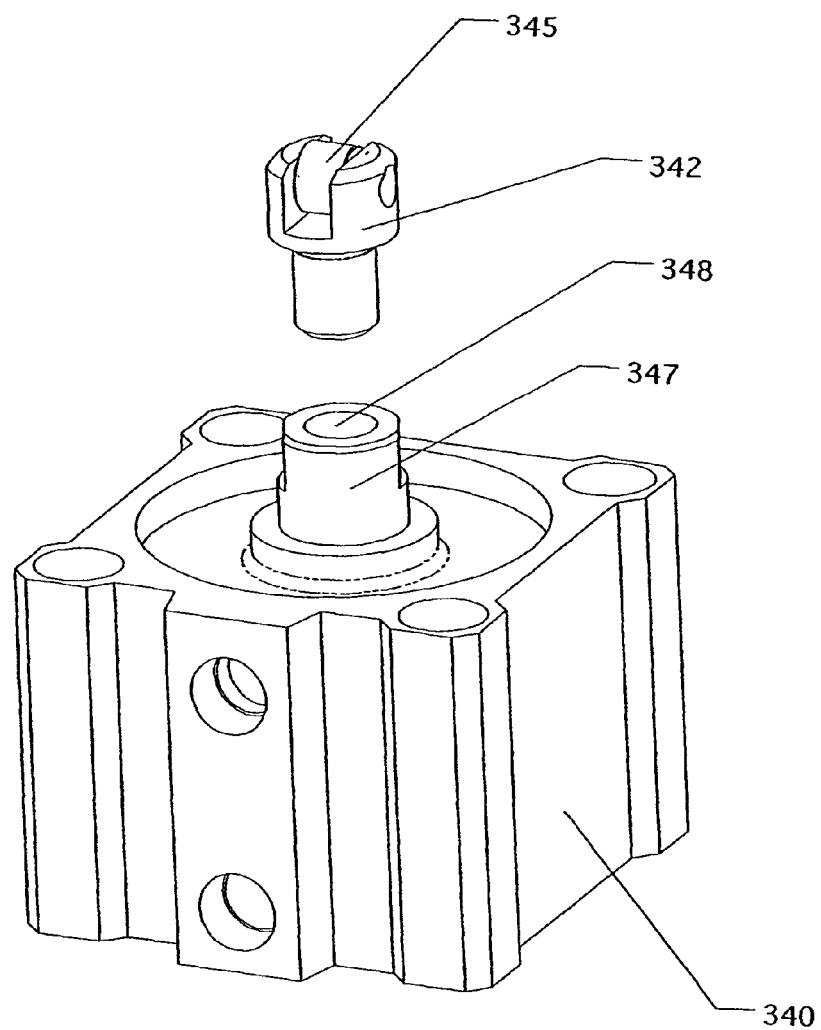
FIG. 14 is an exploded perspective view of a pneumatic cylinder, a holder adapter, and a cam follower in accordance with an exemplary embodiment of the present invention.

FIG. 14 is a perspective view of pneumatic cylinder 340 (e.g., pneumatic cylinders 340a and 340b illustrated in FIG. 13). Extending from pneumatic cylinder 340a is pneumatic piston rod 347 including distal end 348. The opposite end of pneumatic piston rod 347 is coupled to a piston (not illustrated in FIG. 14). Distal end 348 receives holder adapter 342. Holder adapter 342 holds cam follower 345. As explained above, cam follower 345 (i.e., 345a and 345b) rides on a respective one of curved surfaces 265a and 265b.

Figure 15:
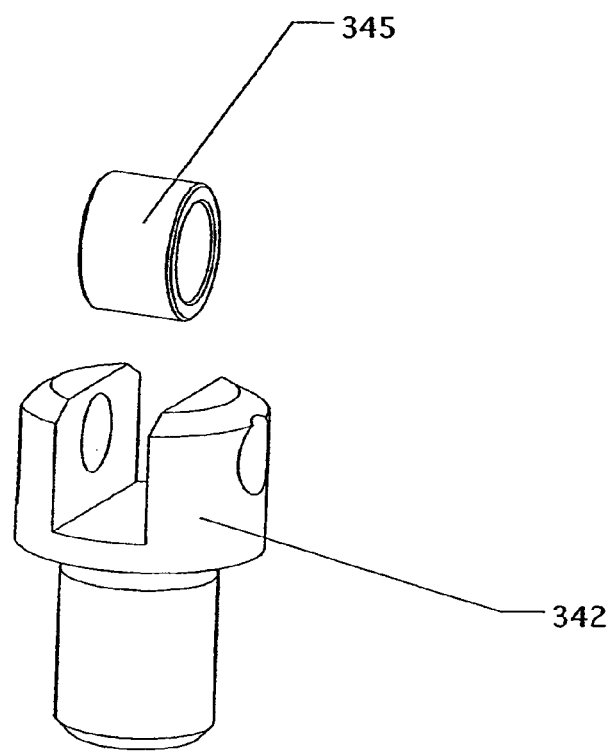
FIG. 15 is an exploded perspective view of the holder adapter and the cam follower illustrated in FIG. 14.

FIG. 15 is a detailed perspective view of holder adapter 342 which holds cam follower 345.

When a test head is mounted in cradle subassembly 60, the weight of the test head tends to pull cradle subassembly 60 in a downward direction. More specifically, cradle subassembly 60 (as well as theta compliance carrier 30, X-carrier subassembly 40, and vertical carrier subassembly 50) would tend to rotate downward about the theta rotation axis (the rotation axis provided by the combination of theta pivot shafts 250a-b and theta pivot bores 351a-b). To combat the gravitational effects of the test head (and the other portions of test head attachment unit 10) springs 325a-d and pneumatic cylinders 340a-b are provided (a combination of features including, for example, springs 325a-d, pneumatic cylinders 340a-b, and theta pivot shafts 259a-b may be described as a coupling that provides rotative coupling about the theta axis). For example, springs 325a-d provide a certain amount of compliant support about the theta axis, such that cradle subassembly 60 cannot rotate downward below a certain position.

In order to raise cradle subassembly 60 above the minimal support position provided by springs 325a-d, pneumatic cylinders 340a and 340b are provided. For example, one or both of pneumatic cylinders 340a and 340b may be pressurized with a fluid (e.g., air) to raise cradle subassembly 60 (and test head) to a desired position about the theta rotation axis. In particular the combination of the springs 325a-d and pneumatic cylinders 340a and 340b provide a nearly constant torque counteracting the torque generated by the load through the range of motion about the theta axis. Thus, with respect to this axis the test head is maintained in a balanced condition and may be moved compliantly.

As such, "shoulder rotational compliance" is provided about the theta axis to provide "theta compliance" with respect to the test interface when docking in a vertical plane with the test head's J axis 104 rotated 90 degrees from the vertical about a horizontal axis orthogonal to its I axis 102 (for example docking in the YZ plane).

As provided above, the load of the test head causes a torque to be applied about the axis defined by pivot shafts 250a and 250b. In use, an equal and opposite torque is supplied by the combination of cylinders 340a and 340b, and springs 325a-d. The springs provide a component of torque, which varies as the lengths of the springs vary with rotation; however, since the designed motion may only be plus or minus 2.5 degrees, the variation in spring force may be relatively small in comparison to the springs' total force. Pneumatic cylinders 340a and 340b operate with a closely regulated air supply, so the force and torque component, which they supply, is substantially constant. The length and force of the two outer springs 325a and 325d may be adjusted by turning setscrews 270a and 270d (illustrated in FIG. 25). Setscrews 270a and 270d may be turned (and thereby actuated), for example, by inserting a hex wrench through access holes 275a and 275d (also illustrated in FIG. 25).

Initially the system may be set up with no air supplied to the pneumatic cylinders 340a and 340b, and as such, the torque supplied by springs 325a-d alone counterbalances the load at a position below the horizontal plane. By adjusting set screws 270a and 270d, the spring force may be adjusted to varying loads. Pneumatic cylinders 340a and 340b may then pressurized to a point where the load is at a horizontal position. The load may then be rotated compliantly about the axis defined by pivots 351a and 351b with a relatively small amount of force. A pressure regulation system may be provided to adjust the pressure in cylinders 340a and 340b and to maintain the pressure at a constant value as the load is rotated. By providing this compliant motion about the theta axis, a degree of freedom which otherwise may have been lost, is provided.

Figure 16:
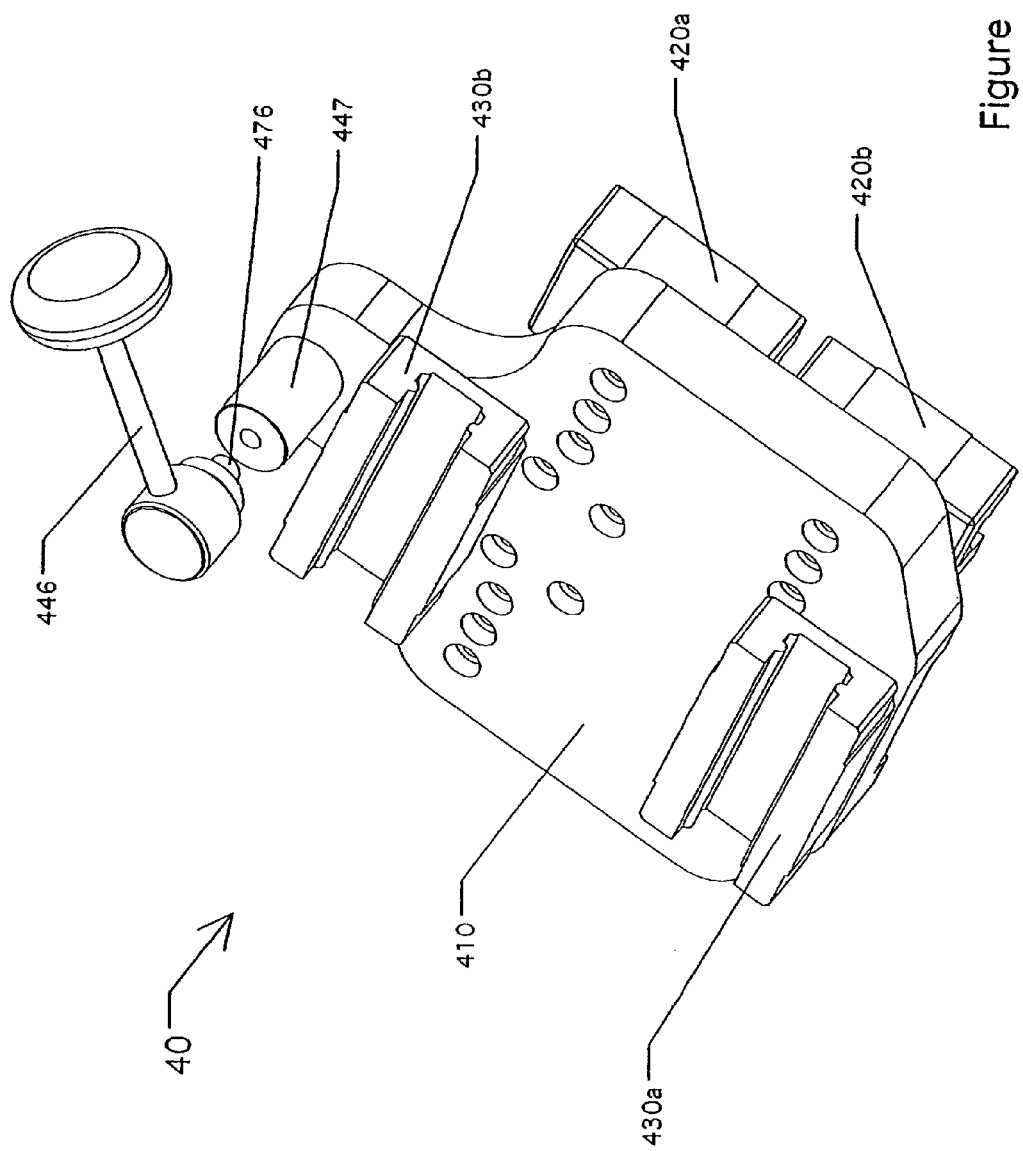
FIG. 16 is a rear perspective view of an X-carrier subassembly in accordance with an exemplary embodiment of the present invention.

FIG. 16 is a rear perspective view of X-carrier subassembly 40. X-carrier subassembly 40 includes plate 410 and linear guide bearings 430a and 430b. Linear guide bearings 430a and 430b engage with a respective one of linear rails 330a and 330b to effect horizontal motion. A portion of linear guide bearings 420a and 420b are also visible in FIG. 16. Linear guide bearing 420a and 420b, as well as linear guide bearings 420c and 420d (not shown in FIG. 16) engage with linear rails 520a and 520b (not shown in FIG. 16), to effect vertical motion. X-carrier subassembly 40 also includes lock handle assembly 446 which engages with cylindrical lock block 447 by means of a screw portion 476 which extends through slot 315 in theta compliance unit 30 (FIG. 13). For example, cylindrical lock block 447 includes a threaded hole to receive lock handle assembly 446. By rotating lock handle assembly 446 the locking mechanism of cylindrical lock block 447 may be activated or deactivated.

Figure 17:
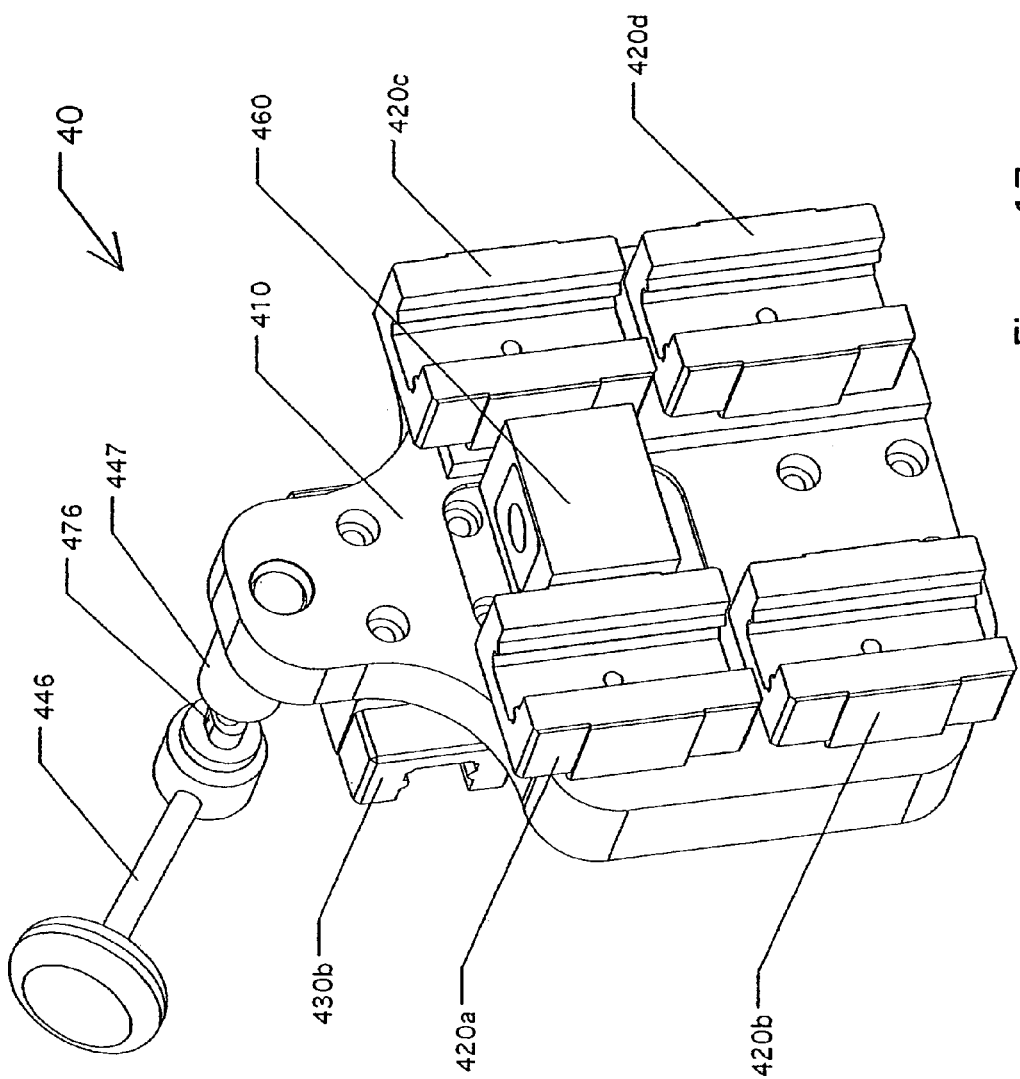
FIG. 17 is a front perspective view of the X-carrier subassembly illustrated in FIG. 16.

FIG. 17 is a front perspective view of X-carrier subassembly 40 including mounting plate 410, lock handle assembly 446, cylindrical lock block 447, linear guide bearing 430b, and linear guide bearings 420a-d. Also shown in FIG. 17 is nut 460 which is configured to receive lead screw 530 (not shown in FIG. 17). Engagement between nut 460 and lead screw 530 facilitates vertical positional adjustments.

Figure 18:
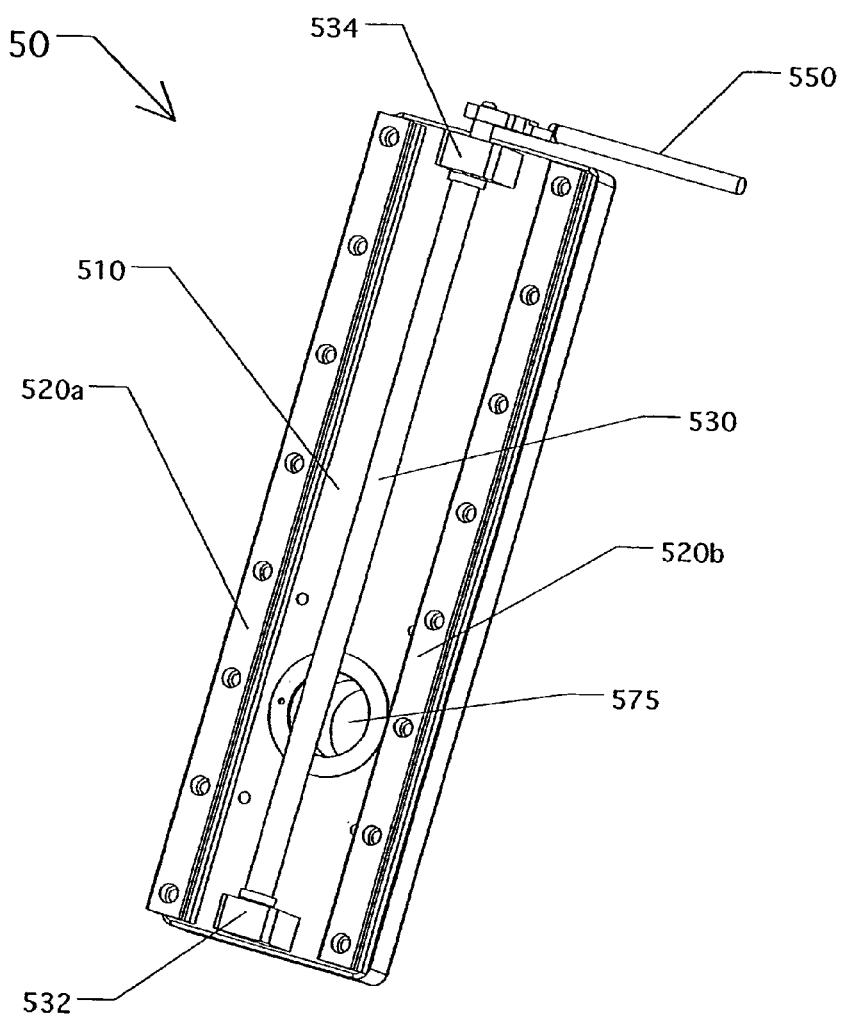
FIG. 18 is a rear perspective view of a vertical carrier subassembly in accordance with an exemplary embodiment of the present invention.

FIG. 18 is a rear perspective view of vertical carrier subassembly 50 including mounting plate 510, and linear rails 520a and 520b. As explained above with respect to FIGS. 16-17, linear guide bearings 420a-420d engage with a respective one of linear rails 520a and 520b to facilitate vertical motion. Vertical carrier subassembly 50 also includes lower bearing 532 and upper bearing 534 each of which supports an end of lead screw 530. More specifically, lower bearing 532 supports a lower end of lead screw 530, and upper bearing 534 supports an upper end of lead screw 530. Ratchet handle 550 is used for turning lead screw 530 through lower bearing 532 and upper bearing 534 (and nut 460) to provide for vertical positional adjustments. As is later elaborated upon, alternatives to ratchet handle 550 are readily possible.

Figure 19:
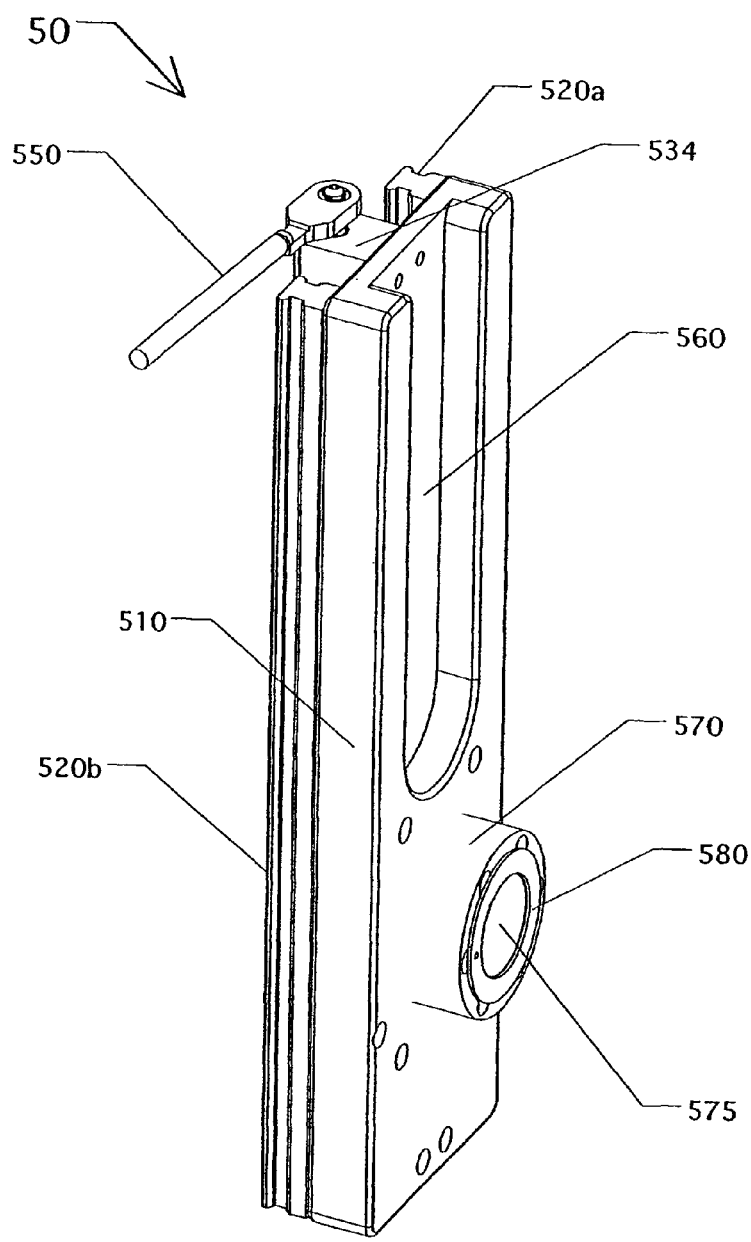
FIG. 19 is a front perspective view of the vertical carrier subassembly illustrated in FIG. 18.

Mounting plate 510 defines bore 575, as shown in FIG. 18. FIG. 19 is a front perspective view of vertical carrier subassembly 50, including mounting plate 510, linear rails 520a and 520b, ratchet handle 550, and upper bearing 534. Also shown in FIG. 19 is boss 570 formed on mounting plate 510. Bore 575 extends through boss 570. Bore 575 is configured to receive mounting shaft 635 of cradle subassembly 60 (not shown in FIG. 19). Bearing 580 is provided between bore 575 and cradle mounting shaft 635.

Mounting plate 510 also defines groove 560 which provides clearance for other apparatuses. For example, such clearance may be provided to facilitate access to other components attached to cradle subassembly 60.

As explained above, conventional test head manipulator systems may not provide an efficient and effective way to dock a test head with different peripheral equipment at substantially different heights and test site orientations (e.g., probers and device handlers). The test head manipulator disclosed herein, including test head attachment unit 10, overcomes such deficiencies. According to various exemplary embodiments of the present invention, positioning and manipulation of a test head is provided in the vertical direction by at least two distinct subsystems. For example, a first subsystem is provided in that piston rod 8, which extends through pneumatic box 4 (see FIG. 3), can raise and lower test head attachment unit 10 (including a test head) up and down within a vertical range of motion. Additionally, vertical carrier subassembly 50 provides an additional range of motion in the vertical direction through the use of ratchet handle 550 (or other device), lead screw 530, lower bearing 532, upper bearing 534, and nut 460. Although there may be overlap between the range of motion provided by each of these subsystems, the combination of the two subsystems provides a broader range of motion in the vertical direction, thereby allowing for a test head to be docked with peripheral equipment of varying heights. Further, the vertical range of motion provided by vertical carrier subassembly 50 is simple, effective, and relatively inexpensive in comparison to conventional vertical positioning systems having the entire range of vertical motion in a single structure.

Although the vertical range of motion provided by vertical carrier subassembly 50 utilizes ratchet handle 550 to rotate lead screw 530, it may be accomplished by alternative means. For example, a wheel type of handle may be provided to rotate lead screw 530. Further, a motor with appropriate gearing could be provided to facilitate this vertical range of motion. In typical use the test head may be roughly positioned relative to a particular peripheral through adjustments of lead screw 530 to bring it within the range of operation with piston rod 8. Thereafter, more precise positioning and compliant docking is provided by operation of the main vertical pneumatic cylinder (or other vertical compliant motion device if so equipped).

Figure 20:
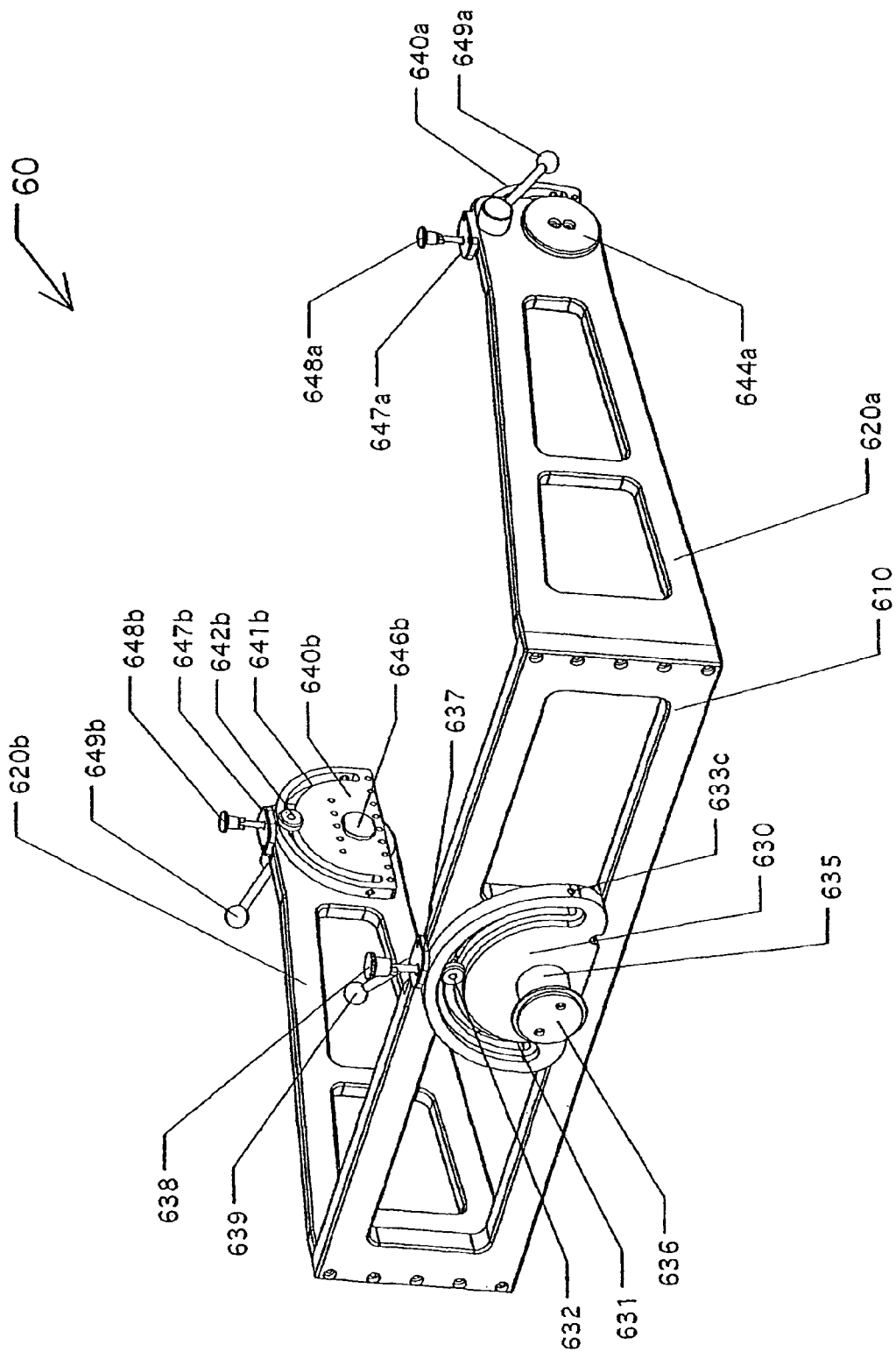
FIG. 20 is a rear perspective view of a cradle subassembly in accordance with an exemplary embodiment of the present invention.

FIG. 20 is a rear perspective view of cradle subassembly 60 including cradle rear 610 and cradle sides 620a and 620b. Coupled to cradle rear 610 is cradle mounting plate 630 (for providing rotation about a horizontal axis orthogonal to the test heads I axis 102) which defines semi-circular slot 631 along which cam follower 632 (which is attached to cradle rear 610) rides. Cradle mounting shaft 635 extends through cradle mounting plate 630, and as explained above, cradle mounting shaft 635 fits in bearing 580 within bore 575. Cap 636 is coupled (e.g., screwed) to an end portion of cradle mounting shaft 635 to retain cradle subassembly 60 in place once it has been mounted. Indexing holes 633a-c are provided for the described rotation and are dispersed at −90 degrees, 0 degrees, and +90 degrees along the semi-circular portion of cradle mounting plate 630 (only indexing hole 633c is visible in FIG. 20). Bracket 637 is provided for attaching indexing pin 638 (e.g., retractable, spring-loaded indexing pin 638) to cradle mounting plate 630. Lock handle assembly 639 is provided for locking cradle 60 about the rotation axis.

Mounting plates 640a and 640b (for providing pitch rotation about the test head's I axis 102) are coupled to a respective one of cradle sides 620a and 620b. Mounting plates 640a and 640b (which are shown in more detail in FIG. 23) are provided for coupling the test head to cradle subassembly 60. Further, a range of motion about the I axis is also provided using mounting plates 640a and 640b. Each of mounting plates 640a and 640b defines a respective semi-circular slot 641a-b for receiving a respective cam follower 642a-b. Each of cam followers 642a and 642b are attached to a respective one of cradle sides 620a and 620b.

Mounting shafts 644a and 644b (644b is not visible in FIG. 20), and flanges 646a and 646b (flange 646a is not visible in FIG. 20), are provided for pivotably receiving mounting plates 640a and 640b. The test head is rigidly attached to plates 640a and 640b. Thus, the test head may pivot about the axis defined by mounting shafts 644a and 644b, which are arranged coaxially.

Brackets 647a and 647b are provided for attaching a respective one of indexing pins 648a and 648b (e.g., retractable, spring-loaded indexing pins) to their respective mounting plates 640a and 640b. Additionally, lock handle assemblies 649a and 649b are provided for locking rotative motion about the U-rotative axis.

Figure 21:
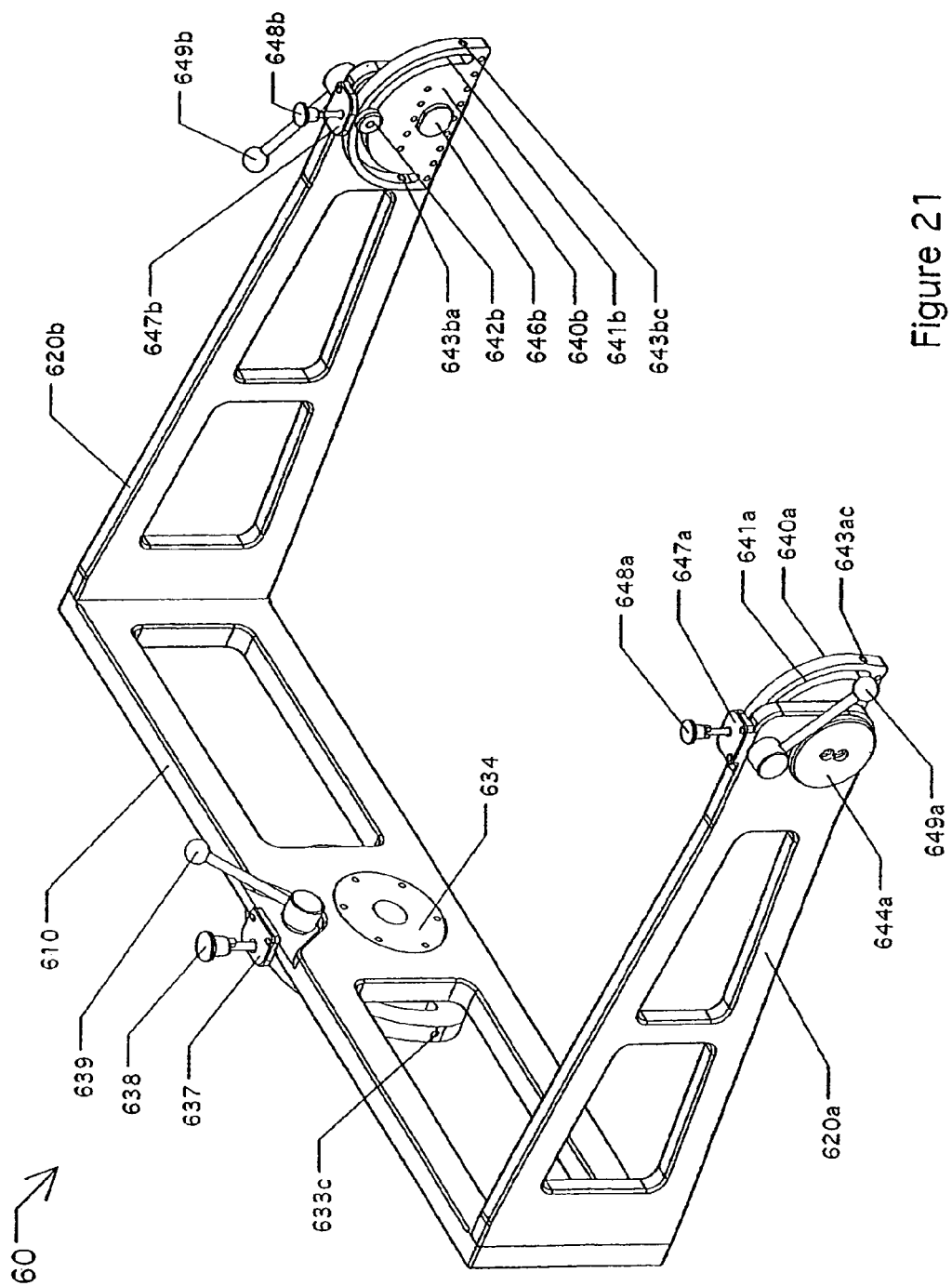
FIG. 21 is a front perspective view of the cradle subassembly illustrated in FIG. 20.

FIG. 21 is a front perspective view of cradle subassembly 60. Flange 634, which is attached to pivot shaft 635, is visible in FIG. 21. Additionally, indexing holes 643ac, 643ba, and 643bc are shown. These indexing holes are part of a group of six indexing holes (643aa, 643ab, 643ac, 643ba, 643bb, and 643bc) for providing fixed points for rotation about the I axis 102, and are dispersed at −90 degree, 0 degree, and +90 degree positions along the arc of their respective mounting plate.

Figure 22:
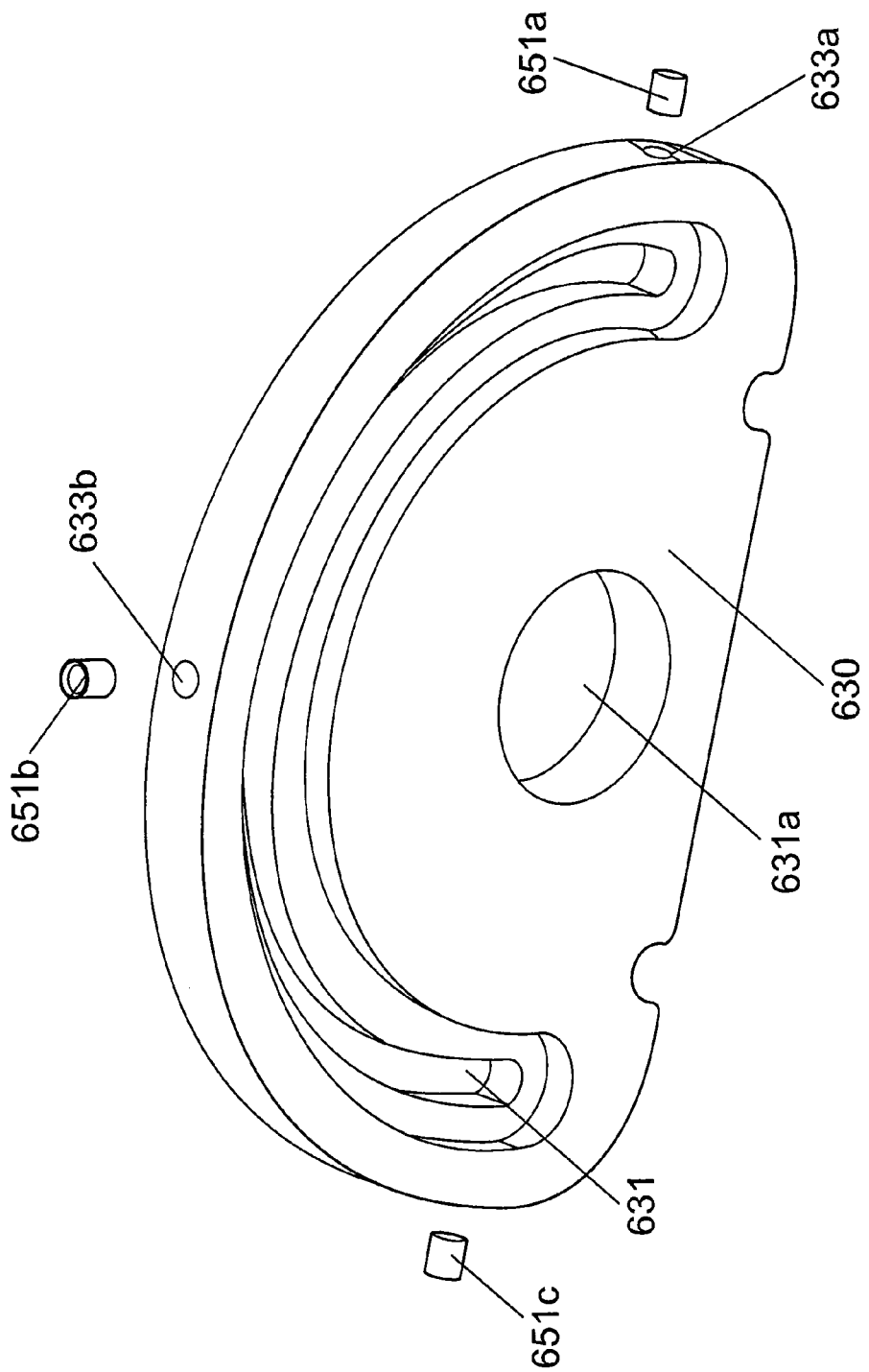
FIG. 22 is a perspective view of a cradle mounting plate useful for providing roll motion in accordance with an exemplary embodiment of the present invention.

FIG. 22 is a perspective view of cradle mounting plate 630. Cradle mounting plate 630 defines semi-circular slot 631 and through hole 631a. As provided above, semi-circular slot 631 receives cam follower 632. Through hole 631a receives cradle mounting shaft 635. Also shown in FIG. 22 are indexing holes 633a and 633b, which along with indexing hole 633c, provide for preset points of rotation, and are dispersed at −90 degree, 0 degree, and +90 degree positions about the arc of cradle mounting plate 630. Also illustrated in FIG. 22 are wear-resistant bushings 651a, 651b, and 651c. Bushings 651a, 651b, and 651c are provided to line indexing holes 633a-c. For example, these wear-resistant bushings are made of steel while mounting plate 630 may be made of aluminum.

Figure 23:
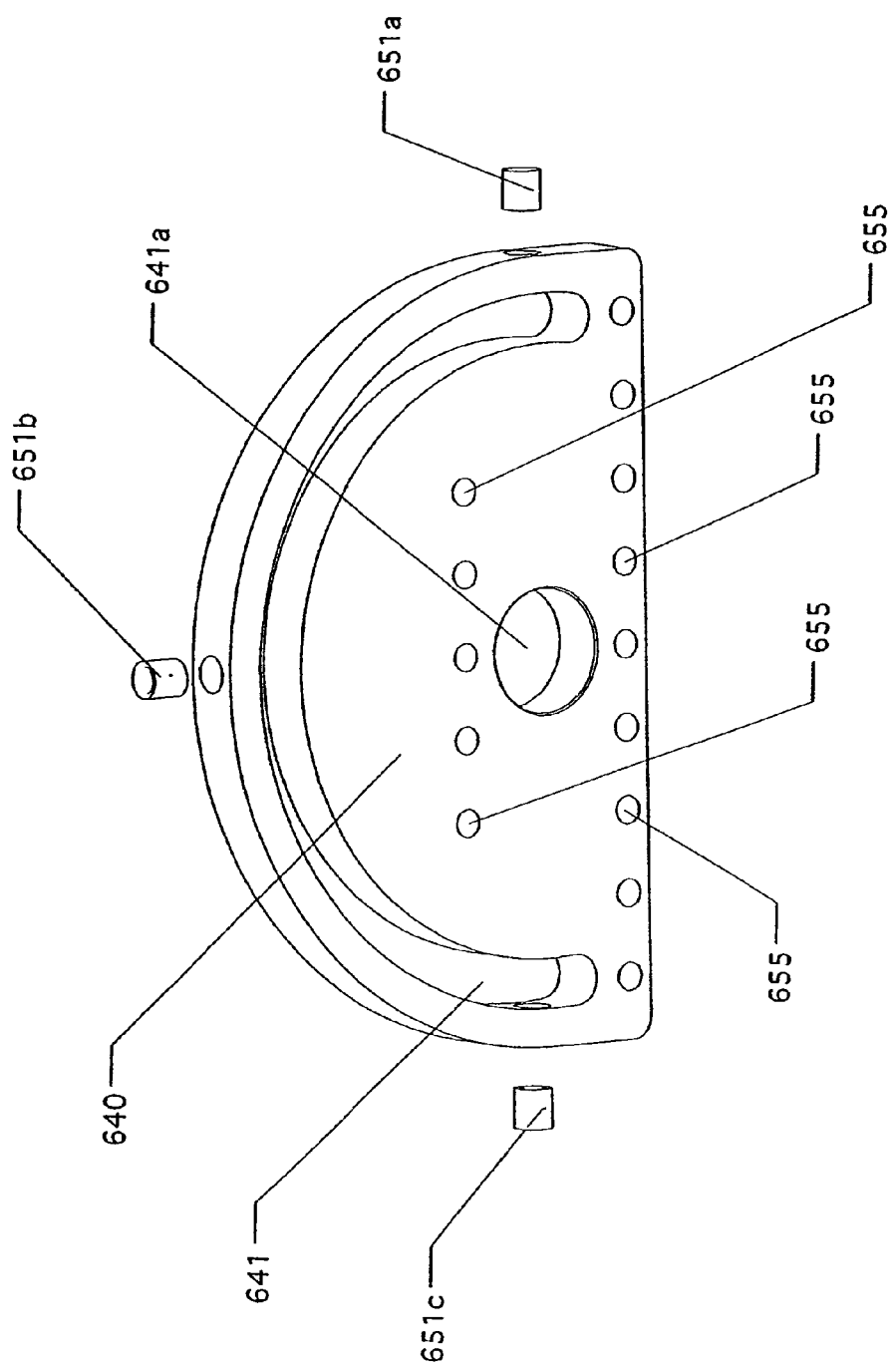
FIG. 23 is a perspective view of a cradle mounting plate useful for providing pitch motion in accordance with an exemplary embodiment of the present invention.

FIG. 23 is a perspective view of mounting plate 640 (e.g., one of mounting plates 640a and 640b). As provided above, mounting plate 640 defines semi-circular slot 641 for receiving cam follower 642. Mounting plate 640 also defines through hole 641a for receiving a shaft (not visible) attached to a flange (flange 646a or 646b). The test head is rigidly attached to mounting plates 640a and 640b which are rotatably attached to the cradle. FIG. 23 also illustrates wear-resistant bushings 651a, 651b, and 651c for insertion into respective lined indexing holes. Further, mounting plate 640 illustrated in FIG. 23 also defines a number of test head mounting holes 655. Test head mounting holes 655 allow the test head to be mounted in different positions so that the center of gravity of the test head can be placed as is desired with respect to the pivot axis. Preferably the pivot axis passes through or as close as possible to the test head's center of gravity to provide a balanced condition for compliant motion.

Figure 24:
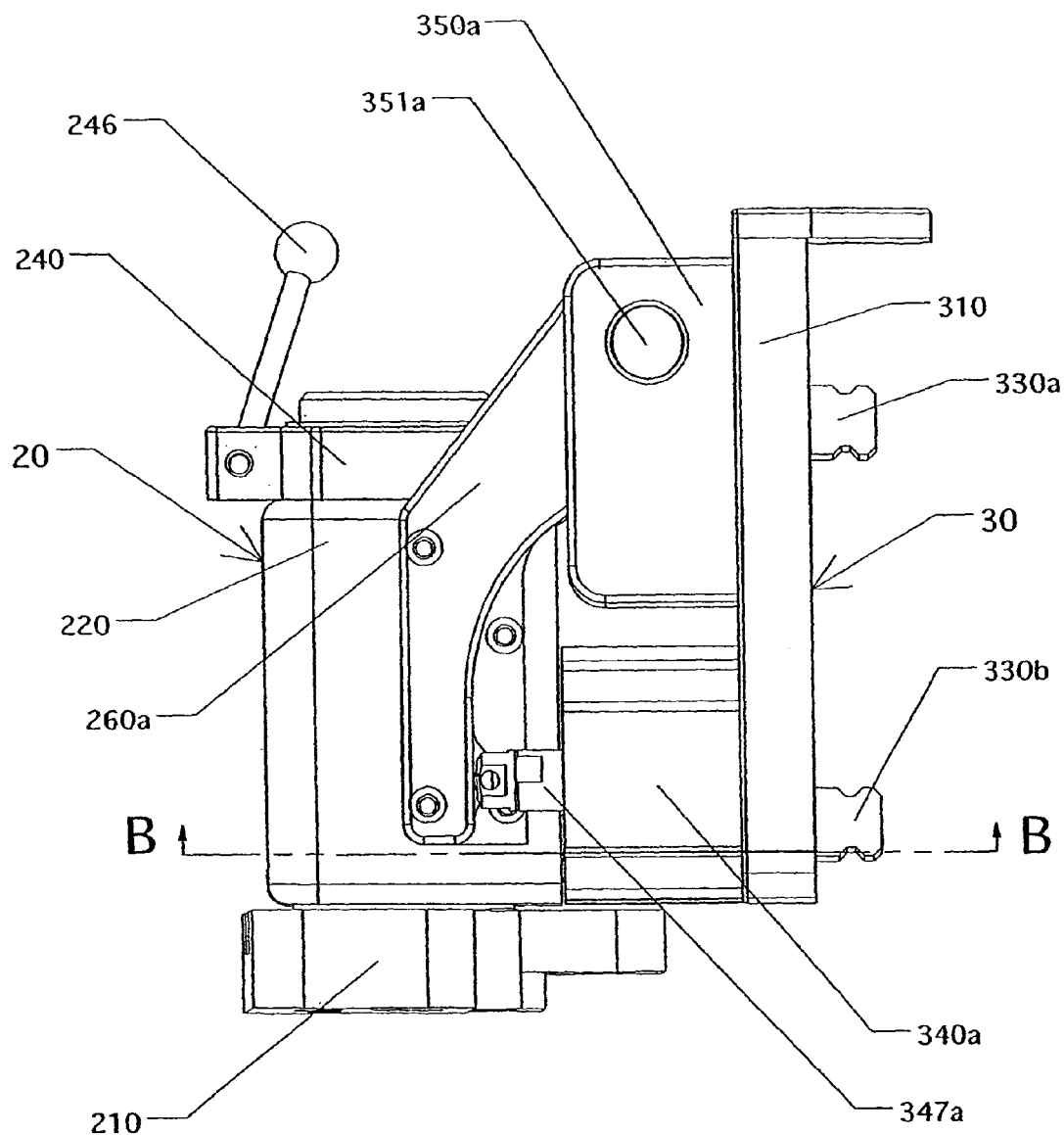
FIG. 24 is a side view of a swing unit subassembly and a theta compliance carrier in accordance with an exemplary embodiment of the present invention.

FIG. 24 is a side view of swing unit subassembly 20 coupled with theta compliance carrier 30. Various features of swing unit subassembly 20 are illustrated in FIG. 24 including base 210, mounting block 260a, block 220, lock block 240, and lock handle 246. Additionally, various components of theta compliance carrier 30 are also illustrated in FIG. 24 including mounting plate 310, linear rails 330a and 330b, pneumatic cylinder 340a, theta pivot block 350a, theta pivot bore 351a, and pneumatic piston rod 347a.

FIG. 25 is a sectional view of FIG. 24 taken across section B-B. FIG. 25 provides an internal view of springs 325a, 325b, 325c, and 325d all having one end inserted in its respective spring receiving bore 322a-322b in mounting plate 310. Springs 325a and 325d are connected to a respective one of spring set screws 270a and 270d through spring caps 370a and 370d. Springs 325a and 325d, as well as spring caps 370a and 370d, are contained within spring receiving holes 222a and 222d. Spring set screws 270a and 270d may be adjusted through a respective one of spring adjusting access holes 275a and 275d, as well as through holes 224a and 224d.

Other components illustrated in FIG. 25 include linear rail 330b, pneumatic cylinders 340a and 340b, holder adapters 342a and 342b, pneumatic piston rods 347a and 347b, cam followers 345a and 345b, curved surfaces 265a and 265b, and lock block 240.

Figure 26:
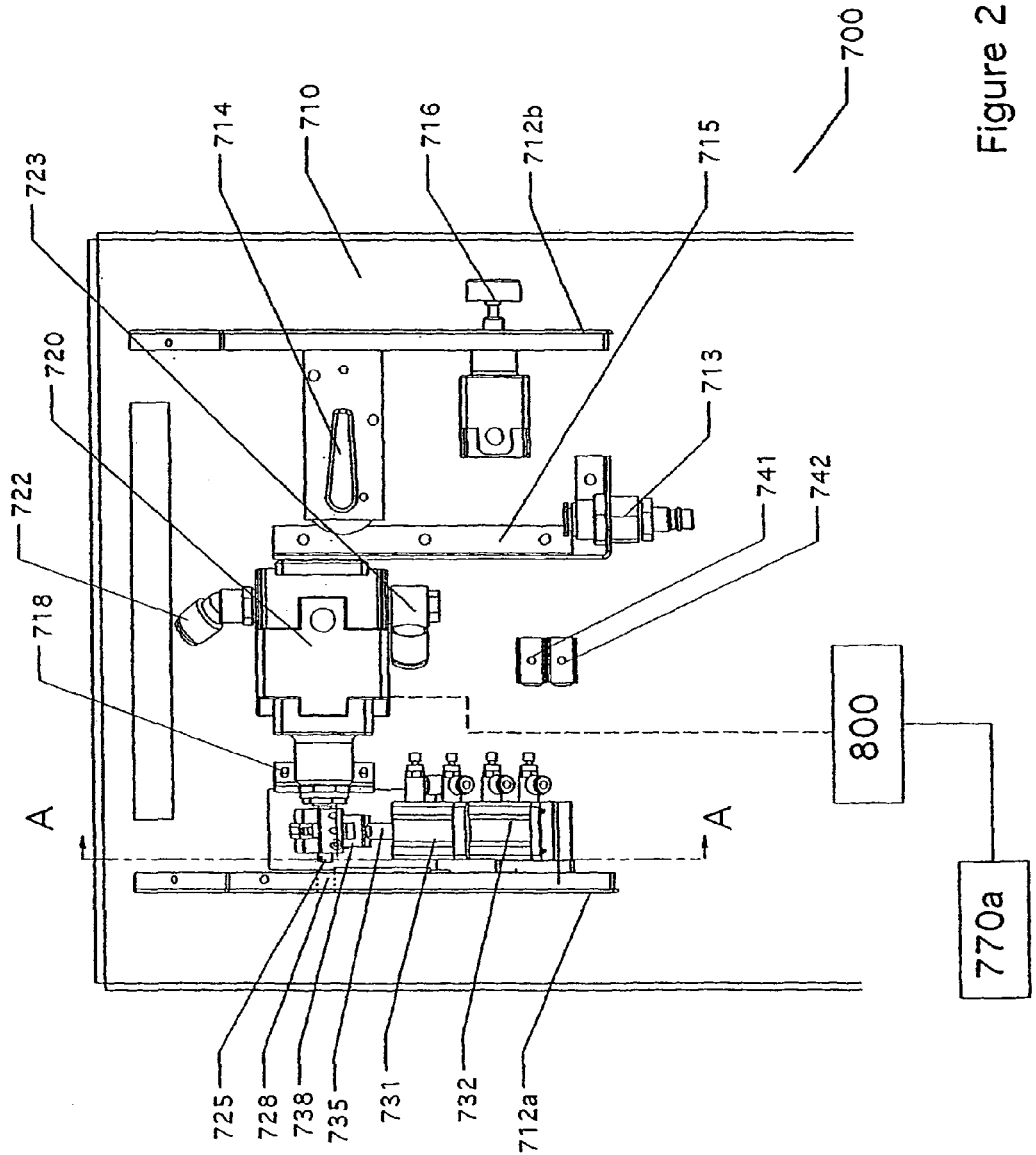
FIG. 26 is a partial internal view of a pneumatics control enclosure in accordance with an exemplary embodiment of the present invention.

FIG. 26 is a partial interior view (a portion of the interior has been removed) of a pneumatics control enclosure 700 for use with a test head manipulator according to an exemplary embodiment of the present invention. For example, enclosure 700 illustrated in FIG. 26 could be used as pneumatic control enclosure 4a illustrated in FIG. 3.

Control enclosure 700 illustrated in FIG. 26 includes mounting plate 710, which may be the rear surface of column unit 4. Enclosure 700 also includes side plates 712a and 712b. Air inlet 713 (e.g., a quick connect air inlet) is provided to facilitate air distribution into the enclosure. Lock handle 714 operates a lock mechanism for locking and preventing operation of the pneumatic system. Stop button 716 may be activated to stop flow of the air through air inlet 713. Mounting bracket 715 and bracket 718 are provided to support components within control enclosure 700. Air regulator 720 is connected to regulator ports 722 and 723. For example, one of regulator ports 722 and 723 may be an inlet port, and the other of regulator ports 722 and 723 may be an outlet port. Regulator adjusting shaft 725 (i.e., a regulating control device) is provided for regulating regulator 720. Access hole 728 allows an operator to adjust the air pressure by adjusting regulator adjusting shaft 725 (e.g., using a hex, slotted, or Phillips driver). The pneumatic enclosure also houses first pneumatic cylinder 731, second pneumatic cylinder 732, first pneumatic piston rod 735, clevis 738, first control valve 741, and second control valve 742 (the function of each of which will be explained below).

Figure 27:
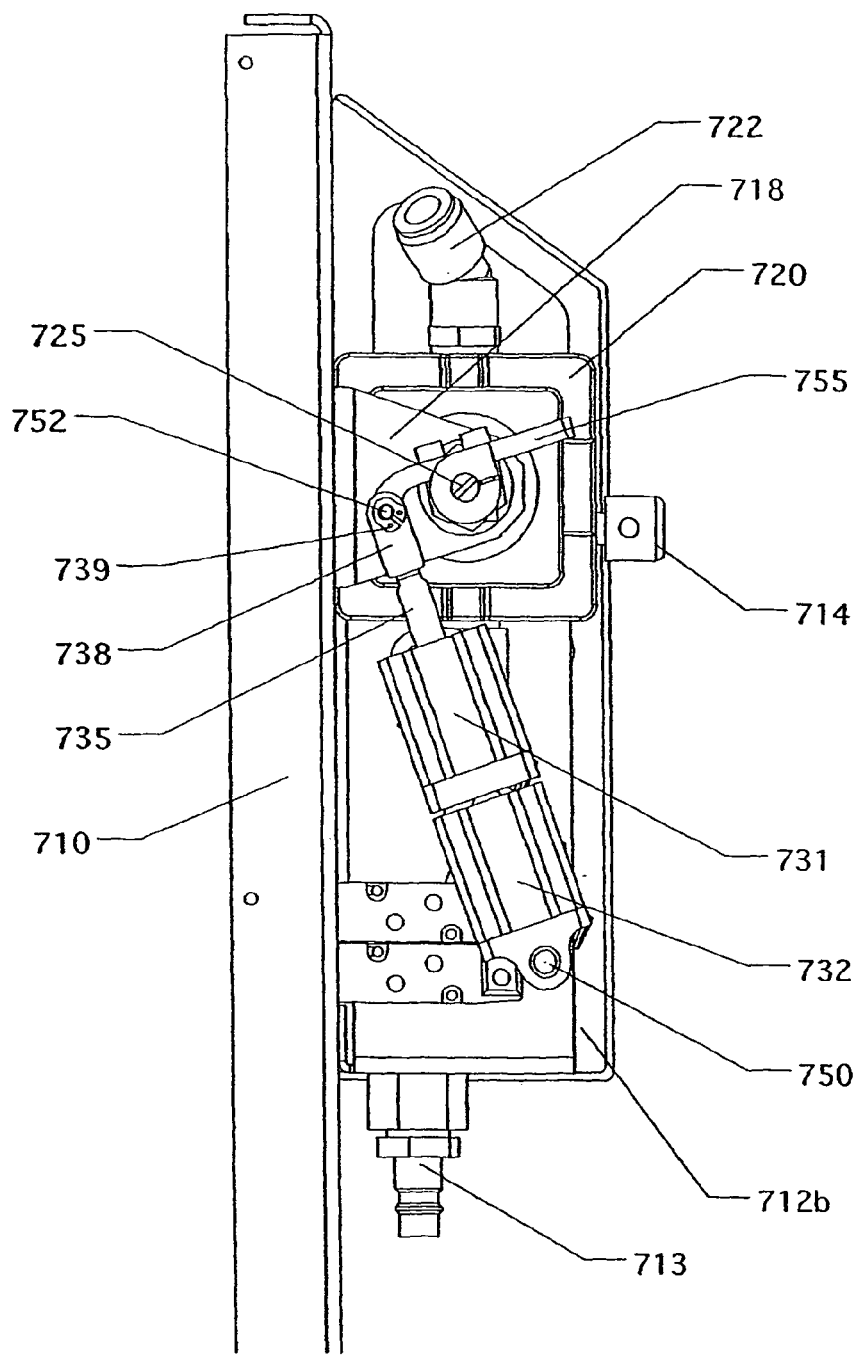
FIG. 27 is a sectional view of FIG. 26 across section A-A.

FIG. 27 is a sectional view of FIG. 26 taken along section A-A. As provided above, regulator adjusting shaft 725 may be adjusted by an operator (through access hole 728) in order to adjust the air pressure distribution from regulator 720. In order to remotely control a position of regulator adjusting shaft 725, the below described components have been provided. Link 755 connects regulator adjusting shaft 725 to pivot pin 752. Pivot pin 752 connects link 755 to clevis 738. Pivot pin 752 extends through spring clip 739. First pneumatic piston rod 735 extends from clevis 738 to first pneumatic cylinder 731. First pneumatic cylinder 731 is connected to second pneumatic cylinder 732. Pivot mount 750 is provided for mounting second pneumatic cylinder 732.

Figure 28:
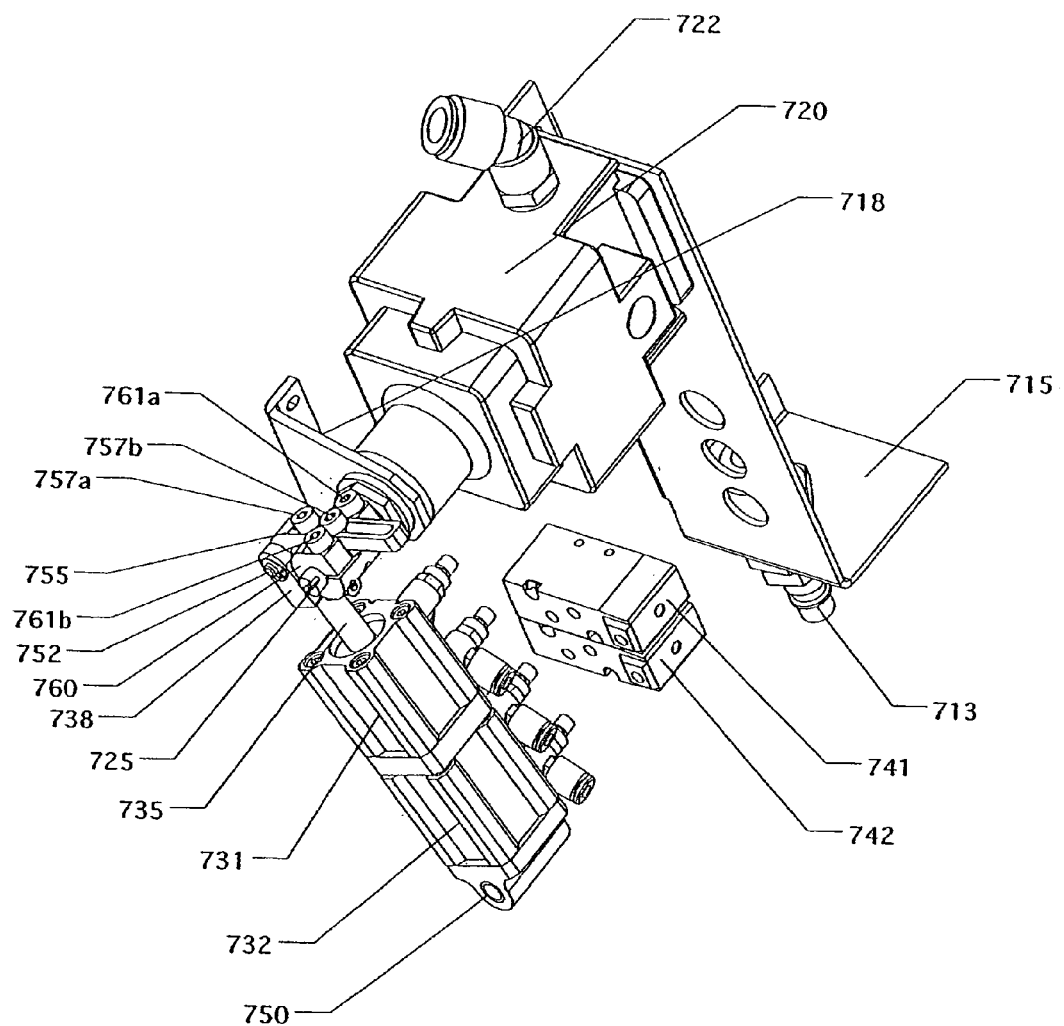
FIG. 28 is a perspective view of a regulator control mechanism in accordance with an exemplary embodiment of the present invention.

FIG. 28 is a perspective view of various elements of the regulator control mechanism illustrated in FIGS. 26-27. Regulator adjusting shaft 725 extends, at least partially, through shaft lock block 760. Screws 757a and 757b attach link 755 to shaft lock block 750. Screws 761a and 761b compress shaft lock block 760 so as to tightly clamp it to regulator adjusting shaft 725. By loosening screws 757a, 757b, 761a, and 761b, and moving link 755 with respect to shaft lock block 760, and then retightening the screws, the amount of regulation of regulator 720 (corresponding to the amount of rotation of regulator adjusting shaft 725) provided through the regulator control mechanism illustrated in FIG. 28 is controlled. As described above, pivot pin 752 connects link 755 to clevis 738. First pneumatic piston rod 735 connects first pneumatic cylinder 731 to clevis 738. First pneumatic cylinder 731 is connected to second pneumatic cylinder 732, which in turn is connected to and mounted using pivot mount 750.

Figure 29:
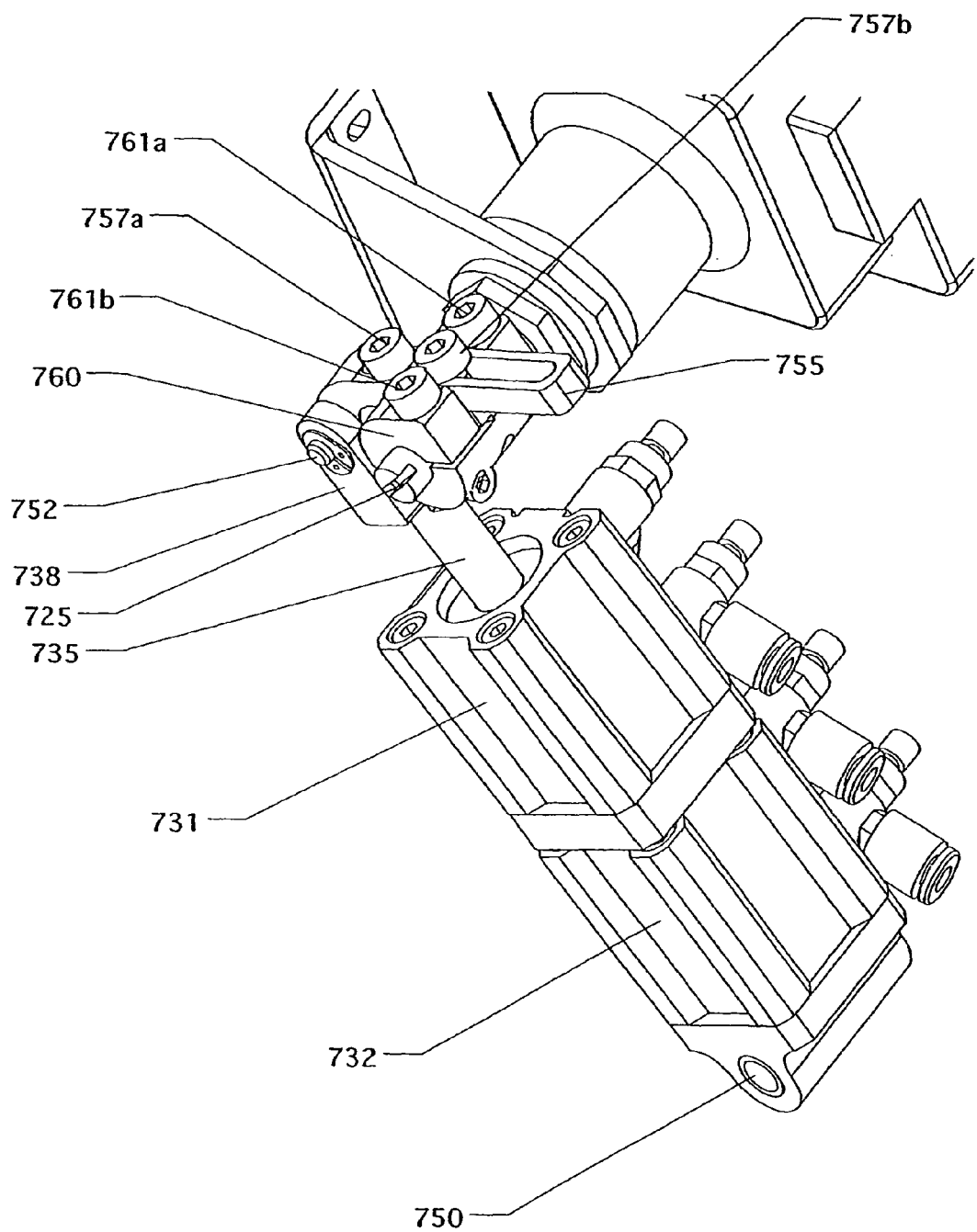
FIG. 29 is a detailed perspective view of a portion of FIG. 28.
Figure 30:
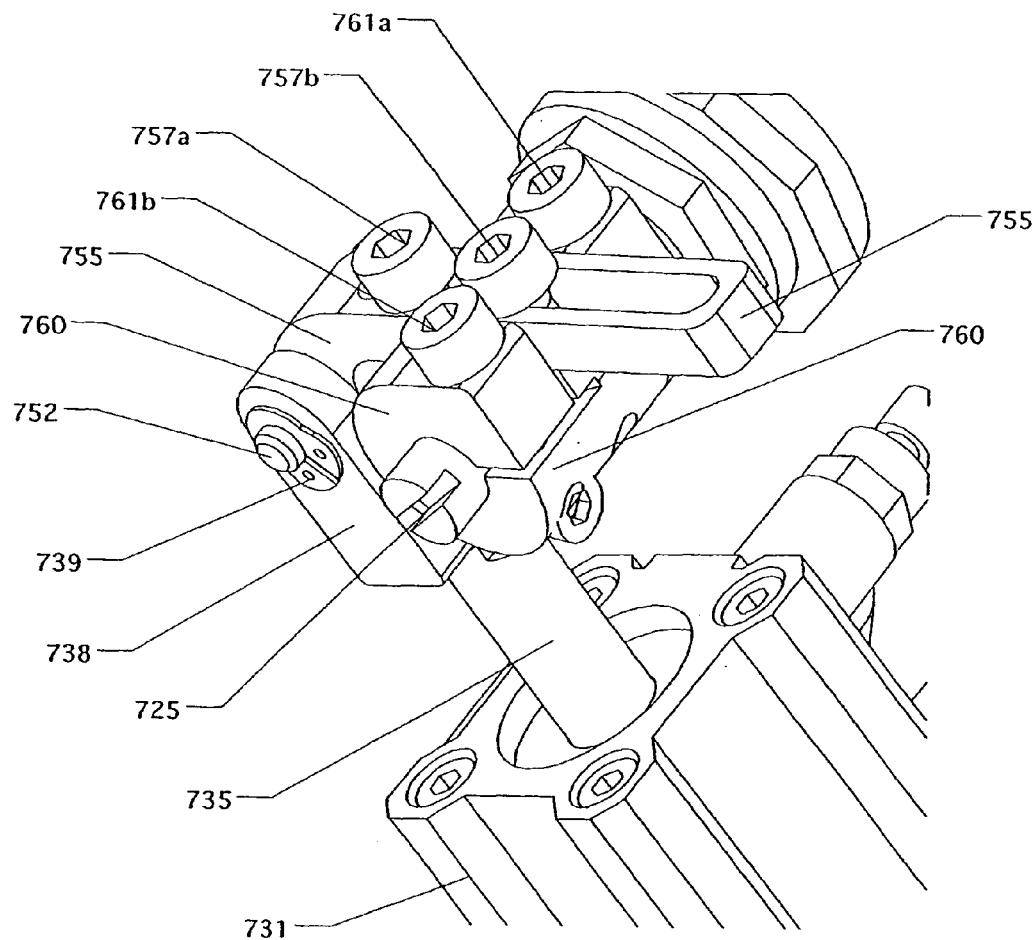
FIG. 30 is another detailed partial perspective view of FIG. 28.

FIG. 29 is a detailed perspective view of a portion of FIG. 28. FIG. 30 is an even more detailed perspective view of a portion of FIG. 28.

The apparatus illustrated in FIGS. 26-30 may be used to assist an operator in positioning a load supported by a pneumatic cylinder. For example, a piston within the main cylinder can support the load of the test head attachment unit and test head. Further, a regulator is provided to maintain the gas within the cylinder at a constant pressure as the test head is raised and lowered by an external force. Thus, the test head is kept in a substantially weightless condition, as described for example in U.S. Pat. No. 5,149,029 and its siblings, all to Smith.

Additional details of the apparatus illustrated in FIGS. 26-30 will now be described. As provided above, FIG. 26 provides a partial layout view of selected components within a pneumatics control enclosure having side plates 712a and 712b. Tubing, etc., which interconnects the various components, is not shown for simplicity. Regulator 720 is included to provide regulated gas pressure to the main vertical cylinder. An exemplary regulator 720 provided is SMC Model IR 3020-F03. Ports 722 and 723 are included to couple to the air supply and main vertical cylinder. Air is supplied to the apparatus within the enclosure via quick connect coupling 713. Bracket 715 provides mounting support for both quick connect 713 and regulator 720. A locking apparatus is included to minimize harmful accidents, and is operated by handle 714. For example, when handle 714 is in the shown 3 o'clock position, the air supply to the apparatus is turned off and a brake is applied to prevent motion of the main vertical cylinder's piston. Thus, the vertical position of the test head is locked in place. When handle 714 is turned clockwise through a position corresponding approximately to 4:30 o'clock, air is applied to regulator 720, and thus the cylinder becomes pressurized to a pressure determined by regulator 720. As handle 714 is further rotated to an approximate 6 o'clock position the brake is released, allowing the test head to be safely moved vertically. Conversely, rotating handle 714 from the 6 o'clock position to the 3 o'clock position causes the brake to be applied first and then causes the air supply to the regulator apparatus to be disconnected.

An operator may adjust the pressure provided by regulator 720 by turning shaft 725. To facilitate such an adjustment, shaft 725 has a screwdriver slot in its distal end. Side plate 712a includes access hole 728 to provide access when the covers are in place. An apparatus is further provided to allow small changes in regulated pressure to be made remotely. This apparatus includes, in addition to other items to be described, cylinders 731 and 732, piston rod 735, clevis 738, and 5/2 control valves 741 and 742.

In use, the pressure provided by regulator 720 is typically adjusted so that the force required to raise the load is approximately equal to the force required to lower the load. When combined with friction and the main vertical cylinder's break away force, the force required for motion can sometimes be larger than desired, particularly when slight, precise motions are required. This difficulty may be overcome, if the pressure is slightly increased if the desired motion is up and slightly decreased if the desired motion is down. Also, it is possible to adjust the regulator to cause the load to move independently. For example, if the regulator is adjusted to provide a pressure that applies a force slightly greater than the cylinder's upwards break away force plus the weight of the load, the load will rise. Conversely, if the regulator is adjusted to provide a force that is less than the weight of the load minus the cylinder's downwards break away force, the load will move downwards. In adjusting the regulator to provide motion, care must be taken to prevent accidents due to either too much or not enough pressure for safe motion.

Figure 32:
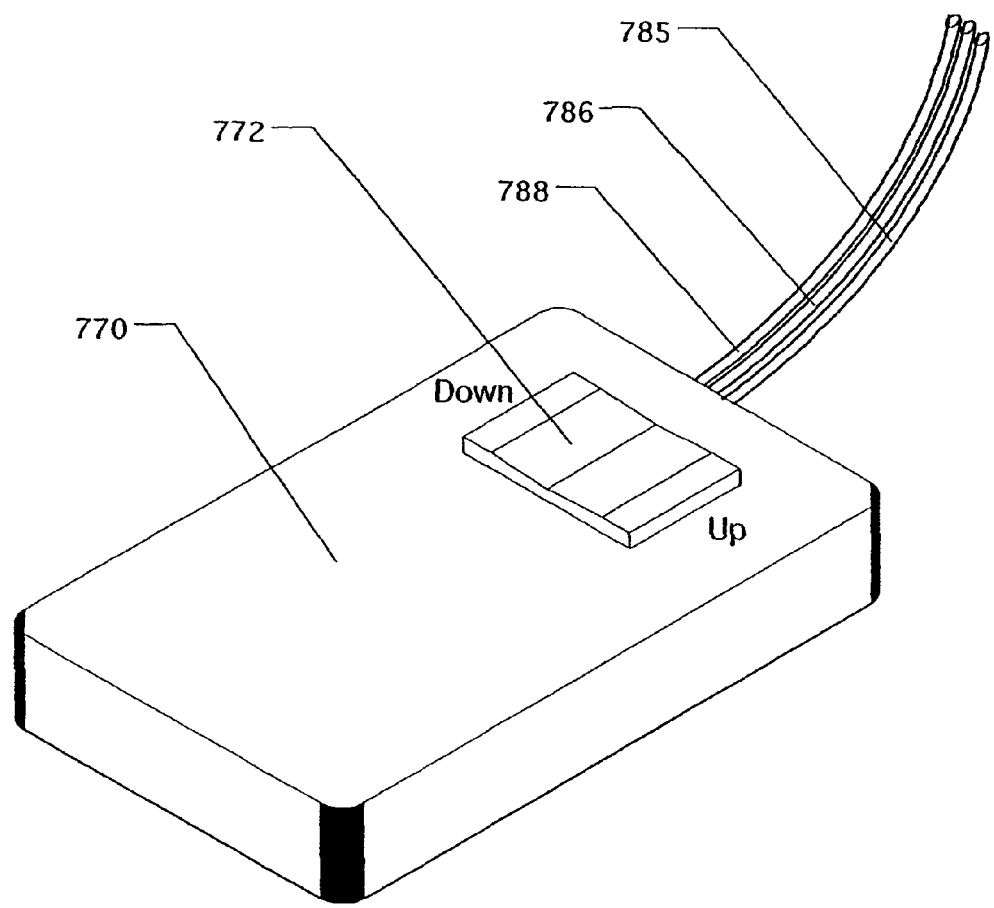
FIG. 32 is a perspective view of a pneumatic control pendant in accordance with an exemplary embodiment of the present invention.

FIG. 32 illustrates a hand held control pendant 770 (i.e., a remote unit 770) including rocker switch 772. Pendant 770 is connected to control enclosure 700 by means of tubes 785, 786, and 788 (i.e., fluid carrier 785, 786, and 788). In the following description it is assumed, without loss of generality, that turning regulator shaft 725 (i.e., regulating control device 725) clockwise increases pressure and turning it counter clockwise decreases pressure. In a first mode of operation ("mode one operation"), control pendant 770 may be used to assist an operator in manually raising or lowering the load. To move up, the operator pushes rocker 772 to the "Up" position and holds it. This causes regulator shaft 725 to be turned slightly clockwise from its nominal position, increasing the pressure in the main vertical cylinder, enabling the operator to more easily move the load up. Conversely, pushing rocker 772 to the "Down" position and holding it, causes regulator shaft 725 to turn slightly counter clockwise from its nominal position, decreasing the pressure in the main vertical cylinder, enabling the operator to easily move the load downwards. Releasing rocker 772 returns it to the neutral position and regulator shaft 725 is returned to its nominal position.

In a second mode of operation ("mode two operation"), control pendant 770 may be used to enable an operator to raise or lower the load without applying external force. In this case pressing rocker 772 to either the Up or Down position causes a somewhat greater rotation of regulator shaft 725 causing, in turn, a greater change in pressure in the main vertical cylinder than in the first mode of operation. The pressure change is adjusted to be great enough to allow the load to move without an applied external force but small enough so that the motion is reasonably slow and stoppable by releasing rocker 772, which allows regulator shaft 725 to return to its nominal position. Thus, to move up in the second mode of operation, the operator pushes rocker 772 to the "Up" position and holds it. This causes regulator shaft 725 to be turned clockwise from its nominal position, increasing the pressure in the main vertical cylinder to a point where the load moves upwards. Conversely, pushing rocker 772 to the "Down" position and holding it, causes regulator shaft 725 (i.e., regulating control device 725) to turn counter clockwise from its nominal position, decreasing the pressure in the main vertical cylinder to a point where the load move downwards. Releasing rocker 772 returns it to the neutral position and regulator shaft 725 is returned to its nominal position and the motion of the load stops.

Returning again to FIGS. 28 through 30, an oblique view of the apparatus is provided. Two small pneumatic cylinders 731 and 732 are included. Cylinder 732 is mounted so that it can pivot about pivot mount 750, which in turn is attached to enclosure 700. Cylinder 731 is attached to the distal end of the piston rod (not visible) of cylinder 732. Thus, cylinder 731 moves together with the piston of cylinder 732. Piston rod 735 of cylinder 731 has clevis 738 attached to its distal end. Link 755 is attached to clevis 738 by means of clevis pin 752 and spring clip 739 in a conventional manner.

Shaft lock block 760 surrounds regulator shaft 725, and it is slit as shown. Screws 761a and 761b may be tightened to clamp lock block 760 securely to shaft 725. Specifically, shaft 725 may be rotated by rotating lock block 760 when screws 761a and 761b have been tightened. When screws 761a and 761b are loosened, shaft 725 may be rotated by a screwdriver without changing the position of block 760.

Link 755 is attached to block 760 by means of screws 757a and 757b, which pass through the slot shown in link 755. Link 755 is mounted within a slot in block 760, which is perpendicular to shaft 725. When screws 757a and 757b are loosened, link 755 may be positioned orthogonally with respect to shaft 725. When screws 757a and 757b are tightened, the position of link 755 with respect to shaft 725 is fixed. Thus, the distance between shaft 725 and clevis pin 752, that is, the working length of link 755, may be adjusted.

Figure 31A:
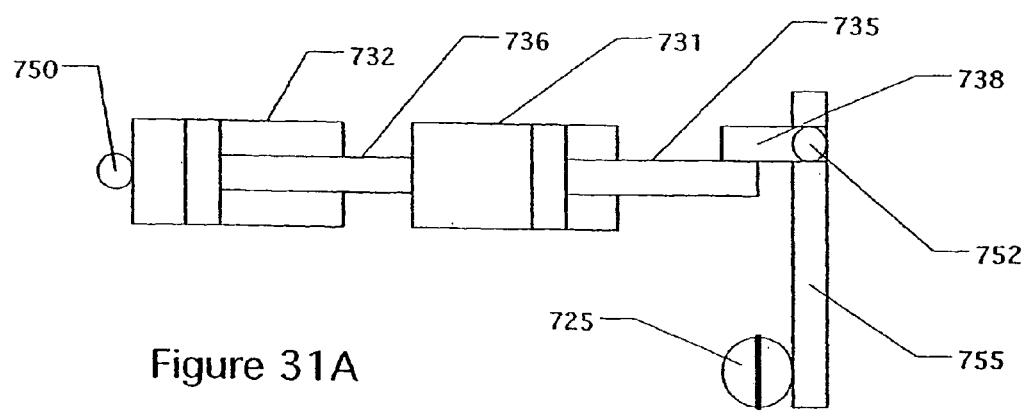
FIGS. 31A-31C are schematic representations of the regulator control mechanism illustrated in FIG. 28.

The operation of the mechanism may now be described with the aid of FIGS. 31A, 31B, and 31C, which schematically show the apparatus in three different positions. FIG. 31A shows the mechanism in it nominal position. The piston in cylinder 732 and its piston rod 736 are retracted and the piston in cylinder 731 and rod 735 are extended. Shaft 725 is in a nominal pressure position as is indicated by the slot being vertical.

Figure 31B:
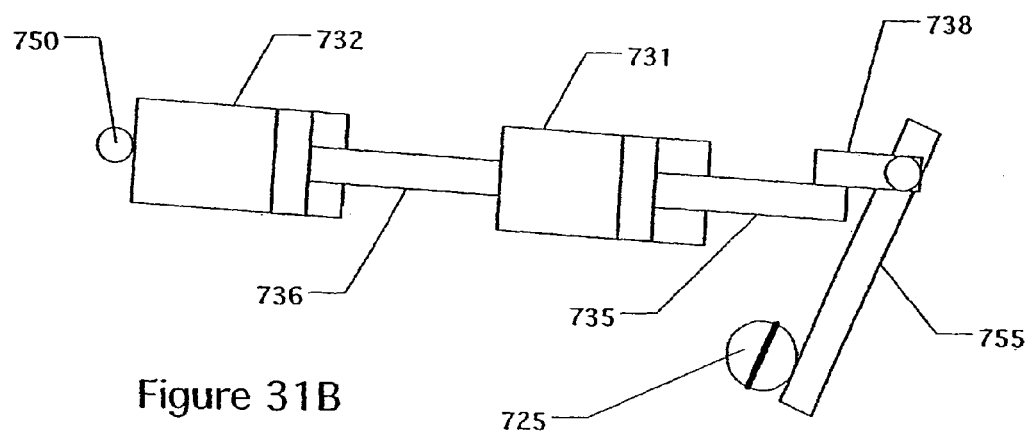

In FIG. 31B, the piston in cylinder 732 and rod 736 have extended, moving to the right, which has caused cylinder 731 and rod 735 to move to the right. This causes link 755 and shaft 725 to rotate clockwise, thus changing the pressure. In the process the assembly comprising cylinders 731 and 732, rods 735 and 736, and clevis 738 rotate about pivot mount 750.

Figure 31C:
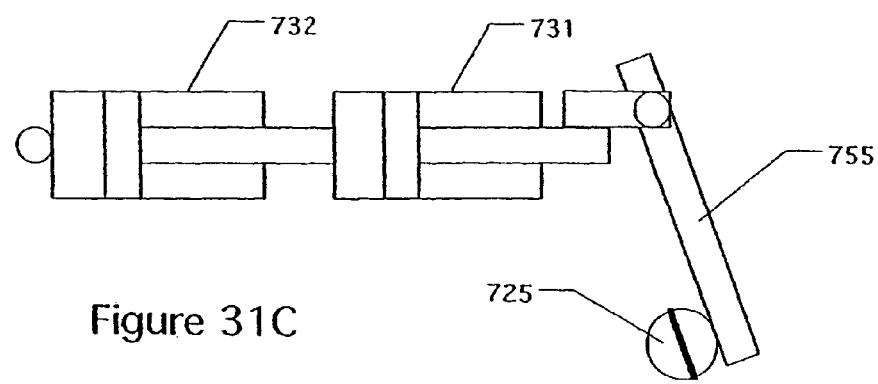

In FIG. 31C, the pistons of both cylinders 731 and 732 are retracted, causing link 755 and shaft 725 to both rotate counter clockwise, thus changing the pressure in an opposite direction.

Figure 33:
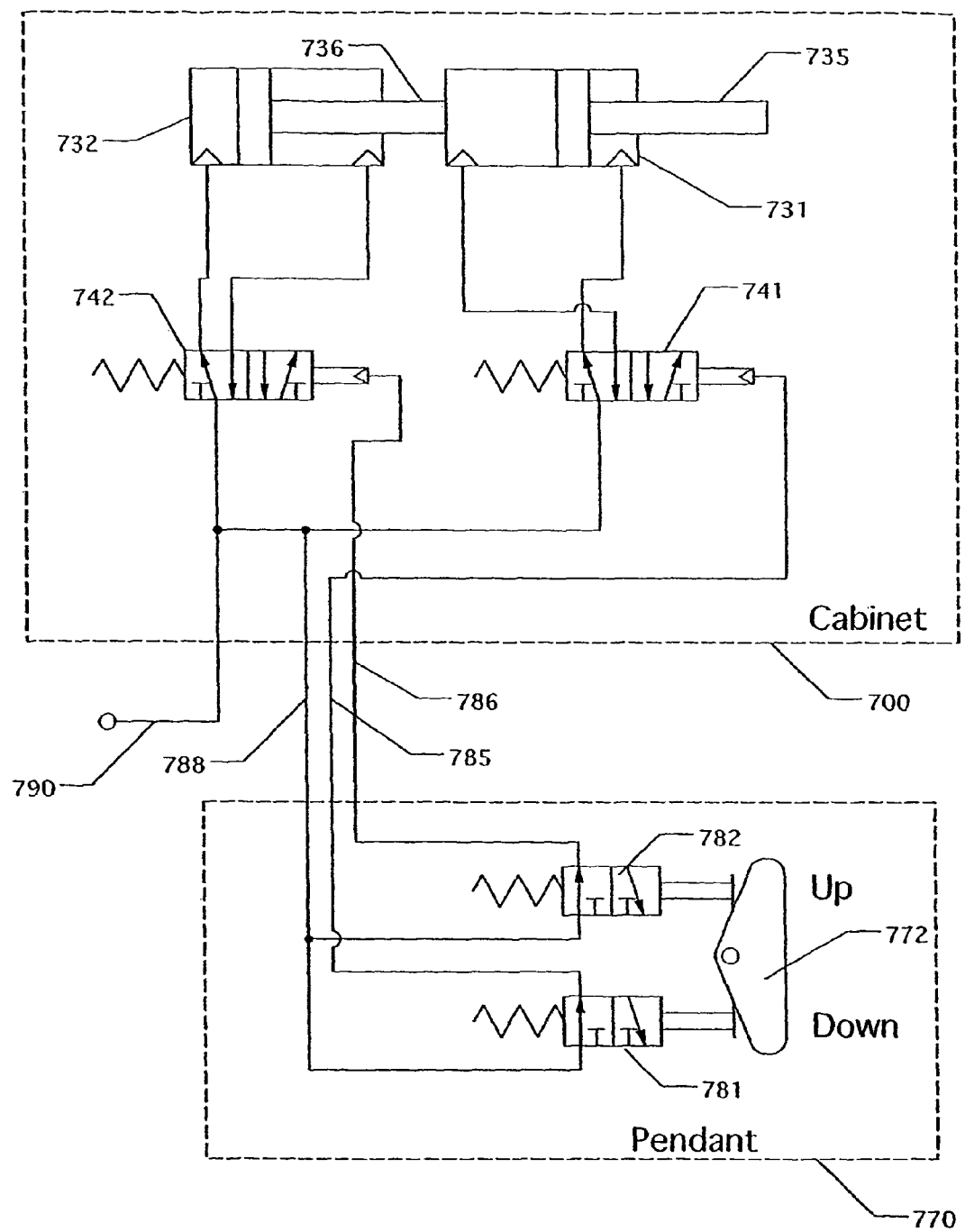
FIG. 33 is a schematic view of various components and interconnections of the regulator control mechanism illustrated in FIG. 28.

FIG. 33 is a schematic diagram illustrating an exemplary control scheme. Air (or other suitable fluid) is provided to the cabinet via tubing 790, which may be connected to quick connect 713 (e.g., quick connect 713 illustrated in FIG. 26). Fluid is then provided to the pendant 770 from the cabinet via tube 788. It is to be noted that the concept works with either compressible (e.g., gasses) or non-compressible (e.g., liquids) fluids. However, in the semiconductor testing environment, gasses such as air, are generally preferred by users.

Within handheld pendant 770 are two manually actuated control valves 781 and 782. Valves 781 and 782 may both be of type 3/2, having three ports and two positions. Rocker 772 activates valves 781 and 782. Both valve 781 and 782 bear against rocker 772 due to their included springs. Normally, neither valve is actuated; thus, air is fed into tubes 785 and 786, which connect to activation ports in valves (to be subsequently described) in the cabinet. When rocker 772 is pushed to the Up position, valve 782 is actuated, shutting off the air supply to tube 786. Similarly, when rocker 772 is pushed to the Down position, valve 781 is activated, shutting off the air supply to tube 785.

Valves 741 and 742 within cabinet 700 are used to control cylinders 731 and 732, respectively. As is indicated in the exemplary embodiment illustrated in FIG. 33, valves 741 and 742 are five-port, two-position, or 5/2 valves. Further valves 741 and 742 are air actuated with return springs. Pressure in tube 785 actuates valve 741, and pressure in tube 786 actuates valve 742. Thus, with rocker 772 in the nominal position (neither pushed to up nor down) both valves 741 and 742 are actuated. This provides pressure to retract piston rod 736 in cylinder 732 and to extend piston rod 735 in cylinder 731. This is the condition shown in FIG. 31A, corresponding to the nominal setting of regulator adjustment shaft 725.

Depressing rocker 772 to the Up position causes valve 742 to be deactivated. This, in turn, causes the pressure on the previously pressurized side of the piston within cylinder 732 to be relieved and pressure to be applied to the opposite side. Thus, piston rod 736 is extended, and both piston rods 736 and 735 will be extended. This corresponds to the configuration in FIG. 31B, where regulator adjustment shaft 725 has been rotated clockwise, which in the exemplary system increases the pressure applied to the main vertical cylinder, either raising or making the load easier to lift. Releasing rocker 772 allows valve 782 to return to its non-activated position, applying pressure to the actuator of 742. Thus, piston rod 736 will retract, returning the system to the nominal pressure configuration depicted in FIG. 31A.

In a similar manner, pushing rocker 772 to the Down position will cause piston rod 735 of cylinder 731 to retract. This results in regulator adjustment shaft 725 turning counter clockwise as illustrated in FIG. 31C. Thus, in the exemplary system, the pressure supplied to the main vertical cylinder is reduced, either lowering or making it easier to move the load downwards by an external force.

In the exemplary embodiment of the present invention illustrated in FIGS. 31-33, due to the construction of rocker 772 and the configurations of and interconnections between valves 741, 742, 781, and 782, it is not possible for both valves 741 and 742 to be deactivated. This can only occur when pressure is removed from input tubing 790.

According to an exemplary embodiment of the present invention, the following procedure may be followed to set up and adjust the system: Pressure to the system is turned off and the test head is lowered to its lowest position, with the piston of the main vertical cylinder retracted. Screws 757a, 757b, 761a, and 761b are all loosened. Regulator adjustment shaft 725 is turned to a position where it is known that there is insufficient pressure to raise the test head. Air is applied to the system; for example, by turning lock 714 to the on (6 o'clock as previously described) position. Regulator adjustment shaft 725 is slowly turned so as to increase pressure in the main vertical cylinder. As the pressure is increased, the force required to lift the test head is monitored. The pressure is increased until the test head may be raised manually. The test head load may then be manually raised to an approximate midway position where piston rod 8 of the main vertical pneumatic cylinder is approximately 50% extended. Adjustment shaft 725 is adjusted (in both directions) until the pressure is at a point where the force required to raise the test head is approximately the same as the force required to lower the test head. This may be measured by manual "feel" in many cases. Otherwise a spring balance or other instrument could be employed. Screws 761a and 761b, as well as screws 757a and 757b, are now tightened. Rocker 772 is pushed to and held at the Up position. A check may be made to ensure that shaft 725 has rotated clockwise. A further check may be made to ensure that the force required to raise the load has decreased sufficiently for mode one operation or that the load moves upwards at a desirable rate for mode two operation. Rocker 772 is pushed to and held at the Down position. A check may be made with respect to whether the shaft 725 has rotated counter clockwise. A further check may be made to ensure that the force required to move the load downwards has decreased sufficiently for mode one operation or that the load moves downwards at a desirable rate for mode two operation. Screws 757a and 757b may be loosened and the position of link 755 with respect to shaft 725 may be adjusted as desired. The previously defined working length is increased to increase the changes of pressure and thus changes in the required force for movement, and decreased to decrease the changes in pressure and required force. As the working length of link 755 is adjusted, it may become necessary to make small adjustments in the position of lock block 760 to maintain the desired nominal setting. This is accomplished by using screws 761a and 761b. Note, that it may be possible to adjust the working length of link 755 to a point where depressing rocker 772 causes rapid unaided vertical motion of the test head.

In certain situations, such a condition should be avoided for safety concerns, if the motion is not controlled; however, as has been described, in certain exemplary embodiments of the present invention, pendant 770 (i.e., remote unit 770) may be used to control a position of the test head within a range of motion along a vertical axis. In these embodiments, such a substantially vertical range of motion may be a compliant range of motion (i.e., the test head may be provided in a substantially weightless condition within the range of motion). Further, such a substantially vertical range of motion provided through operation of pendant 770 (or operated locally at the manipulator, for example, at control enclosure 700) may be used in conjunction with a second substantially vertical range of motion (e.g., the second substantially vertical range of motion being provided by a second support structure for supporting the load such as vertical carrier subassembly 50 illustrated in FIG. 19) to provide a broad substantially vertical range of motion to the test head.

Through the exemplary embodiments of the present invention illustrated in FIGS. 26-33, a force required to manually manipulate a load such as a test head in a given direction along or about a given axis (even in a compliant state) can be substantially reduced for mode one operation. Also the described embodiments enable mode two operation where a load is controllably moved without human or other external forces in a given directions or about a given axis (even in a compliant state). For example, the system may be configured such that a single depression of a remote switch (e.g., up or down buttons on switch 772) may result in a predetermined amount of rotation of shaft 725, corresponding to a predetermined reduction/addition of force needed to manipulate the test head in a given direction along or about a given axis. In such a configuration, for mode one operation a trained person may incrementally cause rotation of shaft 725, then manually check the force required to manipulate the load in the desired direction, adjust the linkage, and continue this process until the force required to manipulate the test head in the desired direction is acceptable for operation by a low-skilled operator. Similarly, for mode two operation, a trained person may incrementally cause rotation of shaft 725, then manually check for appropriate motion of the load in the desired direction, adjust the linkage, and continue the process until motion in the desired direction is at a rate that is acceptable for safe operation by a low-skilled operator.

Alternatively, the system may be configured to continuously rotate shaft 725 so long as a remote switch (e.g., up or down buttons on switch 772) is depressed. In such a situation, an operator could manually keep a hand on the test head to determine when the force required to manipulate the test head in the desired direction is acceptable, and then release the switch.

Pendant 770 illustrated herein includes no electrical connections, as only fluid (e.g., air) tubing is connected to pendant 770. In certain applications this may be desirable because of a reduced risk of electrical shock, sparking, arcing, etc; however, in some applications, a pendant with electrical, electronic, or microprocessor based control may be desired. FIG. 26 illustrates an optional pendant 770a connected to optional computer 800. Computer 800 may be, for example, mounted within enclosure 700. In such a configuration, pendant 770a may be used to send signals to computer 800 (e.g., increase or decrease pressure signals), and computer 800 may be used to control the regulation of regulator 720. Of course, computer 800 may be any type of microprocessor (or other processor) based system such as a personal computer or a programmable logic controller. Computer 800 may alternatively be replaced by a non-programmable system such as a hard wired logic circuit or an electro-mechanical (e.g., relay) system. With such an advanced controller numerous additional features and operating modes may be added.

Figure 34:
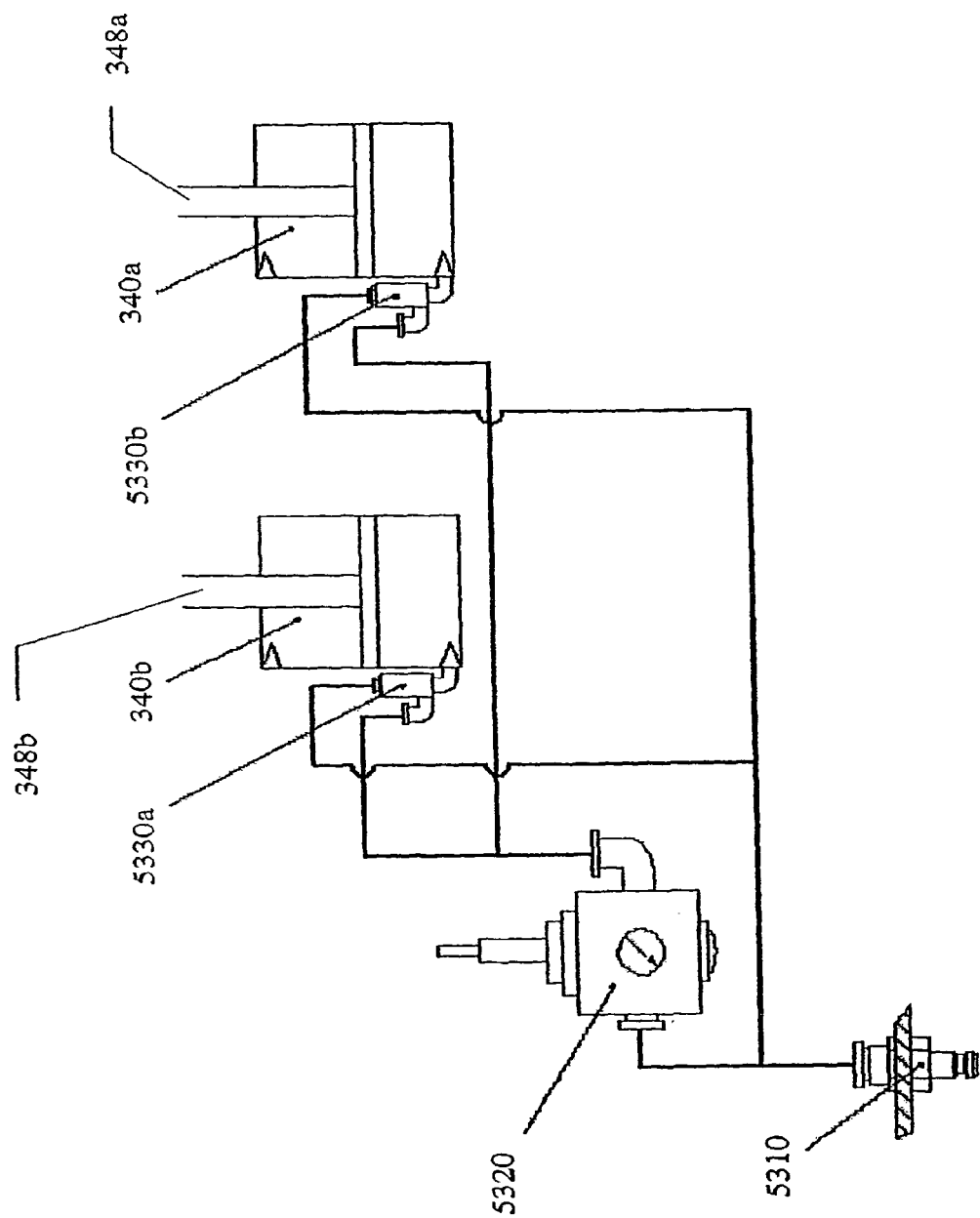
FIG. 34 is a schematic of a pressure regulation system in accordance with an exemplary embodiment of the present invention.

FIG. 34 is an exemplary schematic representation of a pressure regulation apparatus for controlling pneumatic cylinders 340a and 340b. This schematic view is provided as an example as to how pneumatic cylinders used in the present invention may be controlled. Pressurized air is input through quick connection 5310 to the pressure regulation apparatus from an air source that is commonly available in most testing or other industrial facilities.

The pressure regulation system includes a precision pressure regulator 5320, which may be adjusted to provide sufficient pressure to support the load on cylinders 340a and 340b.

Pressure regulator 5320 seeks to maintain constant pressure at its output by allowing more air to flow from input connection 5310 in the event of a pressure drop at the load, and by releasing air in the event of a pressure rise at the load. Regulator 5320 provides such steady state control. Also provided are one-way restrictors 5330a and 5330b, which facilitate adequate transient response in flow to small movements imposed on the load by external forces for positioning purposes. Restrictors 5330a and 5330b are arranged to prevent a return flow through them from cylinder 340.

If the load should now be manually raised (i.e., moved in a direction to extend piston rods 348a and 348b by an externally applied force), with respect to cylinders 340a and 340b, then the pressure in cylinders 340a and 340b is reduced in accordance with the lifting force. Pressure regulator 5320 recognizes the drop in pressure and increases the fluid pressure by feeding additional fluid into cylinders 340a and 340b until the original target pressure is reached. Alternatively, if the load is pressed downwards with respect to its cylinders 340a and 340b, the pressure in cylinders 340a and 340b increases. Pressure regulator 5320 recognizes this pressure increase and diverts fluid out of cylinders 340a and 340b until the original target pressure is reached again.

In the exemplary embodiment being described the two cylinders 340a and 340b are identical. A single regulator 5320 feeds both cylinders 340a and 340b so that the pressure in both is the same. Thus, symmetrical forces are provided which aids in keeping friction and possible binding to a minimum. The total force provided by the two cylinders is then always the same as the force that would be provided by a single cylinder having a piston of twice the area of either of cylinders 340a and 340b.

Figure 35:
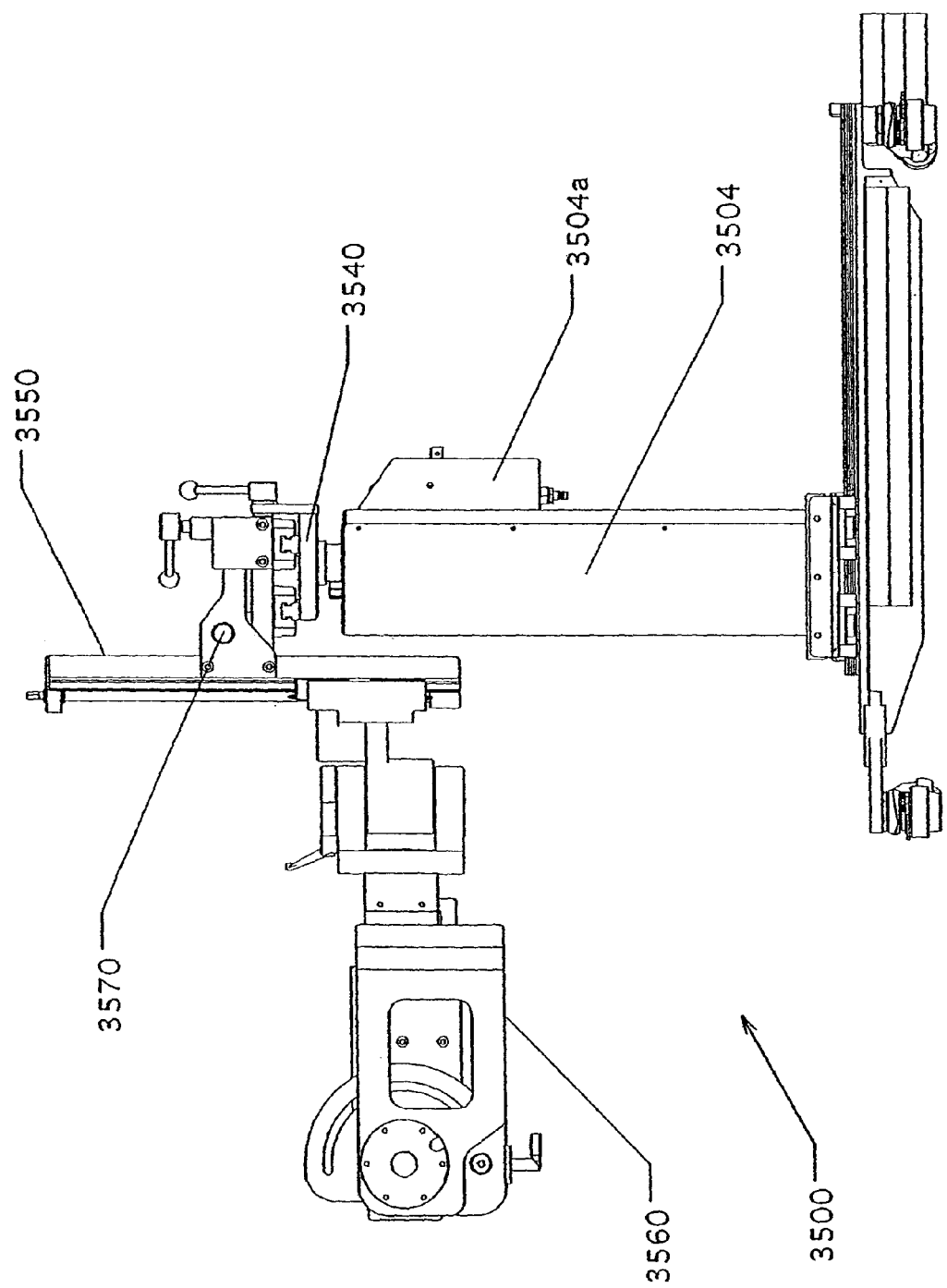
FIG. 35 is a perspective view of a test head manipulator in accordance with an exemplary embodiment of the present invention.

As described above with respect to FIGS. 3-34, the present invention provides a number of novel features for improved manipulation of a load; however, certain embodiments of the present invention do not include each and every one of these features. For example, FIG. 35 is a perspective view of test head manipulator 3500. Test head manipulator 3500 includes many features similar to those described above with respect to test head manipulator 1 illustrated in FIG. 3. For example, test manipulator 3500 includes vertical column unit 3504, control enclosure 3504a, X-carrier subassembly 3540, vertical carrier subassembly 3550, and cradle subassembly 3560. Test head manipulator 3500 provides a load (i.e., a test head) with a rotative range of motion about rotative axis 3570. In contrast to the corresponding rotative axis described above with respect to test head manipulator 1 (rotative about theta pivot bores 351a and 351b illustrated in FIG. 11), the rotative range of motion about rotative axis 3570 is not compliant.

Figure 36:
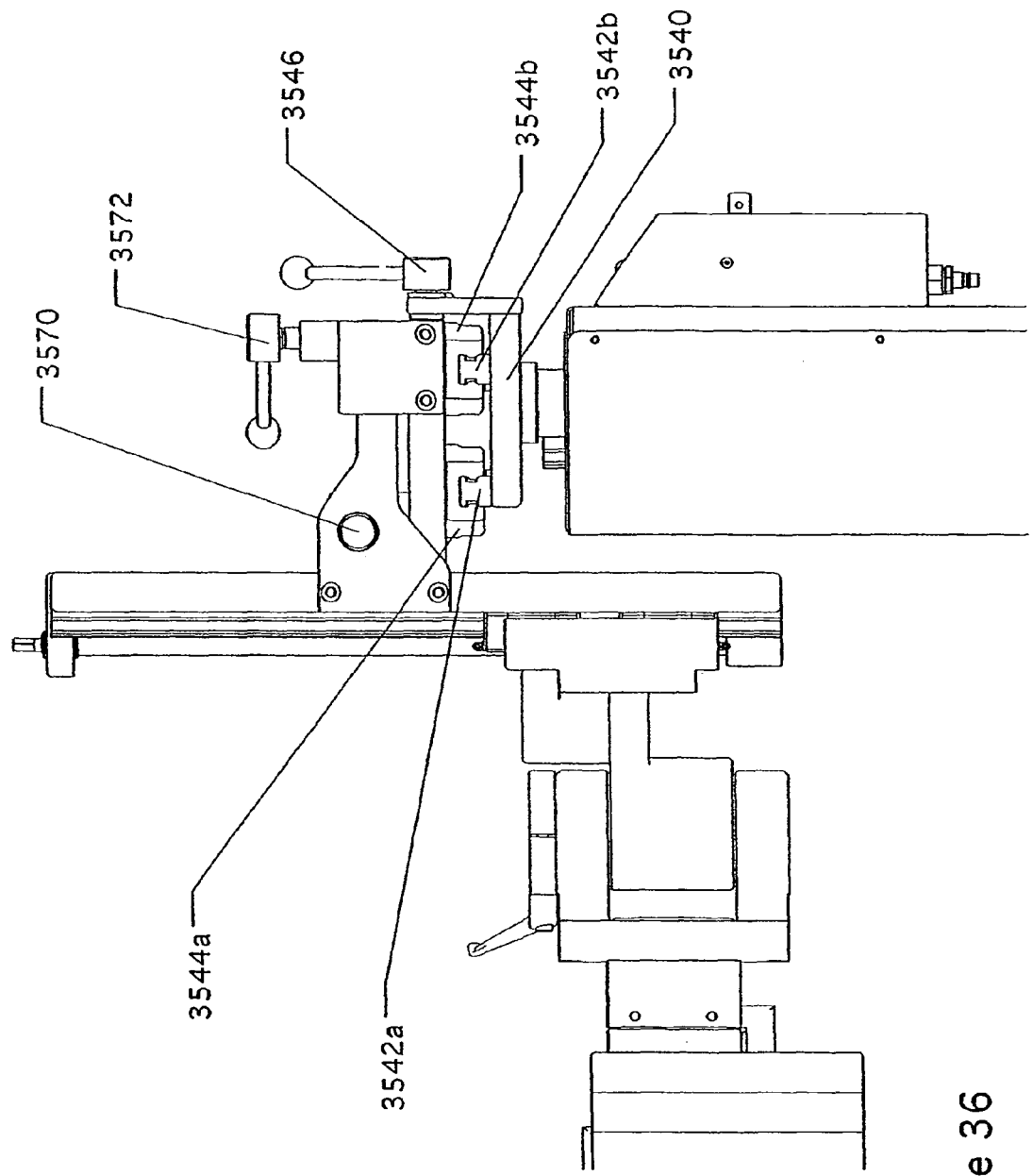
FIG. 36 is detailed view of a portion of FIG. 35.

FIG. 36 is a detailed view of a portion of test head manipulator 3500. As illustrated in FIG. 36, X-carrier subassembly 3540 includes linear bearings 3544a and 3544b that engage and move with respect to rails 3542a and 3542b. Test head manipulator 3500 also includes lock 3546 which locks motion in the side-to-side direction. Test head manipulator 3500 also includes screw handle 3572 which may be adjusted manually (or may be automated and operated remotely) to tilt the load about rotative axis 3570.

Although the present invention has been described primarily in terms of a test head attachment unit situated on a column where pneumatics are used to provide vertical motion in a substantially weightless condition, the novel concepts described herein may also be used with other types of manipulators, including, but not limited to counterbalanced manipulators. The invention does not depend upon the means of providing vertical support and motion.

Various aspects of the present invention have been described using pneumatic systems operating on compressible fluids. Compressibility of a fluid is preferred for the compliance units, which benefit from a constant pressure in a changing volume. The apparatus for adjusting the pressure described above with respect to FIGS. 26-33, incorporates two cylinders 731 and 732, which also operate on air. In this embodiment, a non-compressible hydraulic fluid could be substituted; however, hydraulics are not preferred in certain applications due to the damage that may be caused by leaks, etc. As such, gas-based systems (e.g., air) are typically preferred.

As used herein, the term "fluid" refers to a broad category of fluids including both gases and liquids.

As used herein, the term "compliant mechanism" refers to a mechanism (e.g., a spring, a pneumatic actuator, etc.) that at least partially provides a force for supporting a load in a substantially weightless condition in a direction or about an axis.

As used herein, the term "compliant range of motion" refers to a range of motion of a load in a direction or about an axis, where the load may be supported in the direction or about the axis in a substantially weightless condition.

Although the present invention has primarily been described in terms of a test head for testing integrated circuits, it is not limited thereto. Various aspects of the invention may be applied to any of a number of different loads, particularly heavy loads that precise manipulation and/or positioning.

Although the present invention has been described primarily in terms of supplying air as a pressurizing fluid for cylinders, it is not limited thereto. Any type of fluid, whether a liquid or a gas, may be utilized in these embodiments.

It will be appreciated that other modifications can be made to the illustrated embodiments without departing from the scope of this invention, which is separately defined in the appended claims.

What is claimed:

1. An apparatus for manipulating a load, said apparatus comprising:
   a first support structure for supporting the load for first linear movement over a first range parallel to an axis of the first support;
   a second support structure for supporting the load for second linear movement independent of the first linear movement over a second range; and
   a coupling coupled between said first support structure and said second support structure, said coupling including a compliant mechanism for providing a compliant range of motion to the load about a rotative axis where a center of gravity of the load is located away from said rotative axis, said rotative axis being a non-vertical axis.

2. The apparatus of claim 1 wherein said compliant mechanism is configured to be adjusted manually to account for variations in the load.

3. The apparatus of claim 1 wherein said compliant mechanism includes at least one pneumatic actuator.

4. The apparatus of claim 1 wherein said compliant mechanism includes at least one spring.

5. The apparatus of claim 1 wherein said coupling provides at least one additional range of motion to the load in a direction or about an axis.

6. The apparatus of claim 1 wherein said apparatus is a manipulator for manipulating a test head for testing integrated circuits.

7. The apparatus of claim 1 wherein said second support structure supports said load through a second coupling, said second coupling providing the load with a range of motion about a second rotative axis.

8. The apparatus of claim 1 wherein said first support structure provides the load with a first substantially vertical range of motion, said second support structure provides the load with a second substantially vertical range of motion, said second substantially vertical range of motion being different from said first substantially vertical range of motion.

9. The apparatus of claim 8 wherein at least one of said first substantially vertical range of motion and said second substantially vertical range of motion is a compliant vertical range of motion.

10. The apparatus of claim 9 wherein a position of the load within said compliant vertical range of motion is adjusted by adjusting a fluid pressure supplied to said apparatus, the fluid pressure being adjusted via a control unit located away from said apparatus.

11. A method of manipulating a load, said method comprising the steps of:
    providing a first support structure for supporting the load for first linear movement over a first range parallel to an axis of the first support;
    rotatively coupling the first support structure to a second support structure for supporting the load about a rotative axis such that a center of gravity of the load is located away from the rotative axis, the rotative axis being a non-vertical axis, and the second support structure supporting the load for second linear movement independent of the first linear movement over a second range;
    providing a compliant range of motion to the load about the rotative axis; and
    manipulating the load about the rotative axis using the compliant range of motion.

12. The method of claim 11 wherein said manipulating step includes manually adjusting the load about the rotative axis.

13. The method of claim 11 wherein said step of providing a compliant range of motion includes operating at least one pneumatic actuator positioned between the first support structure and the second support structure.

14. The method of claim 11 wherein said step of providing a compliant range of motion includes providing at least one spring between the first support structure and the second support structure.

15. The method of claim 11 further comprising the step of: providing at least one additional range of motion to the load through a coupling between the first support structure and the second support structure.

16. The method of claim 11 further comprising the step of: rotatively coupling the second support structure to the load to provide the load with a range of motion about a second rotative axis.

17. The method of claim 11 further comprising the steps of:
    providing the load, through the first support structure, with a first substantially vertical range of motion; and
    providing the load, through the second support structure, with a second substantially vertical range of motion, the second substantially vertical range of motion being different from the first substantially vertical range of motion.

18. The method of claim 17 wherein at least one of the first substantially vertical range of motion and the second substantially vertical range of motion provided is a compliant vertical range of motion.

19. The method of claim 18 further comprising the step of: adjusting, via a remote control unit, a position of the load within the compliant vertical range of motion by adjusting a fluid pressure which at least partially provides the compliant vertical range of motion.

20. An apparatus for manipulating a load, said apparatus comprising:
    a first support structure extending substantially vertically from a base and providing the load with a first substantially vertical range of motion;
    a second support structure for supporting the load, said second support structure providing the load with a second substantially vertical range of motion relative to said first substantially vertical range of motion; and
    a coupling between said first support structure and said second support structure such that the second support structure is supported relative to the first support structure, said coupling providing at least one additional range of motion to the load in a direction or about an axis, the additional range of motion not being in a substantially vertical direction.

21. The apparatus of claim 20 wherein at least one of said first substantially vertical range of motion and said second substantially range of motion is a compliant vertical range of motion.

22. The apparatus of claim 21 wherein a position of the load within the compliant range of motion is adjusted by adjusting a fluid pressure supplied to said apparatus, said fluid pressure being adjusted via a control unit located away from said apparatus.

23. The apparatus of claim 20 wherein said apparatus is a manipulator for manipulating a test head for testing integrated circuits.

24. The apparatus of claim 20 wherein said coupling is a rotative coupling.

25. The apparatus of claim 24 wherein said rotative coupling includes a compliant mechanism for providing the additional range of motion as a rotative compliant range of motion about a rotative axis.

26. The apparatus of claim 24 or 25 wherein said second support structure supports said load through a second rotative coupling, said second rotative coupling providing said load with a rotative range of motion about a second rotative axis.

27. The apparatus of claim 25 wherein said rotative axis is not rotative about a substantially vertical plane.

28. The apparatus of claim 20 wherein said at least one additional range of motion includes a substantially horizontal range of motion.

29. A method of manipulating a load, said method comprising the steps of:
  moving the load to a first position within a first substantially vertical range of motion of the load, the first substantially vertical range of motion being provided by a first support structure extending substantially vertically from a base;
  moving the load to a second position within a second substantially vertical range of motion of the load relative to the first substantially vertical range of motion, the second substantially vertical range of motion being provided by a second support structure; and
  providing a coupling between the first support structure and the second support structure such that the second support structure is supported relative to the first support structure, the coupling providing an additional range of motion to the load in a direction or about an axis, the additional range of motion not being in a substantially vertical direction.

30. The method of claim 29 wherein at least one of the first substantially vertical range of motion and the second substantially vertical range of motion is a compliant range of motion.

31. The method of claim 30 further comprising the step of: adjusting a position of the load within the compliant range of motion by adjusting a fluid pressure which at least partially provides the compliant range of motion.

32. The method of claim 29 wherein said step of providing a coupling includes providing a rotative coupling between the first support structure and the second support structure.

33. The method of claim 32 wherein the rotative coupling provides a rotative compliant range of motion to the load about a rotative axis.

34. The method of claim 32 or 33 further comprising the step of: providing a second rotative coupling between the second support structure and the load, the second rotative coupling providing the load with a rotative range of motion about a second rotative axis.

35. The method of claim 29 wherein said step of providing a coupling includes providing a coupling between the first support structure and the second support structure, the coupling providing the additional range of motion to the load in a substantially horizontal direction.

36. An apparatus for remotely changing a position of a regulating control device, the regulating control device regulating a force for at least partially supporting a load, said apparatus comprising:
  a remote unit for varying a fluid pressure, the variation in fluid pressure corresponding to a change in the position of the regulating control device in at least one direction;
  a coupling coupled between said remote unit and the regulating control device, said coupling being configured to change the position of the regulating control device based on the variation in fluid pressure; and
  a fluid carrier for providing the change in fluid pressure from said remote unit to said coupling.

37. The apparatus of claim 36 wherein the regulating control device is configured to regulate the force for at least partially supporting the load in a compliant state in a direction or about an axis.

38. The apparatus of claim 37 wherein the regulating control device is configured to regulate the force for at least partially supporting the load in a compliant state in a substantially vertical direction.

39. The apparatus of claim 36 wherein the change in position of the regulating control device results in a change in a position of the load within a range of motion of the load in a direction or about an axis.

40. The apparatus of claim 39 wherein the change in position of the regulating control device results in a change in a position of the load within a range of motion of the load in a substantially vertical direction.

41. A method of remotely changing the position of a regulating control device, the regulating control device regulating a force for at least partially supporting a load, said method comprising the steps of:
  varying a fluid pressure, via a remote unit, where the variation in fluid pressure corresponds to a change in the position of the regulating control device in at least one direction;
  providing the change in fluid pressure, via a fluid carrier, from the remote unit to a coupling coupled between the remote unit and the regulating control device; and
  changing the position of the regulating control device through the coupling based on the variation in fluid pressure.

42. The method of claim 41 wherein said step of changing the position of the regulating control device results in a corresponding change in the force, the force at least partially supporting the load in a compliant state in a direction or about an axis.

43. The method of claim 42 wherein the force at least partially supports the load in a compliant state in a substantially vertical direction.

44. The method of claim 41 wherein said step of changing the position of the regulating control device results in a change in a position of the load within a range of motion of the load in a direction or about an axis.

45. The method of claim 44 wherein the change in the position of the load within the range of motion is in a substantially vertical direction.

46. An apparatus for manipulating a load, said apparatus comprising:
  a support structure for supporting the load, said support structure providing the load with a range of motion, said range of motion being a compliant range of motion; and
  a remote unit for adjusting a fluid pressure of a fluid system through a fluid carrier, the fluid system providing at least a portion of the force for supporting the load within the compliant range of motion,
  wherein an adjustment of said fluid pressure via said remote unit adjusts the force for supporting the load.

47. The apparatus of claim 46 wherein said remote unit is configured to adjust said fluid pressure to balance the load in a substantially weightless condition within the compliant range of motion.

48. The apparatus of claim 46 wherein said remote unit is configured to adjust said fluid pressure to adjust a position of the load within the compliant range of motion.

49. A method of manipulating a load, said method comprising the steps of:
- providing a support structure for supporting the load, the support structure providing the load with a compliant range of motion; and
- varying a fluid pressure through a fluid carrier, via a remote unit, where the fluid pressure provides at least a portion of a force for supporting the load within the compliant range of motion.

50. The method of claim 49 wherein said varying step includes varying the fluid pressure to balance the load in a substantially weightless condition within the compliant range of motion.

51. The method of claim 49 wherein said varying step includes varying the fluid pressure to adjust a position of the load within the compliant range of motion.

52. A method of manipulating a load, said method comprising the steps of:
- at least partially supporting the load in a compliant state in a direction or about an axis by pressurizing a fluid, such that the load may be moved in the direction or about the axis using a first manual amount of force; and
- remotely adjusting the fluid pressure such that the load may be moved in the direction or about the axis using a second manual amount of force until an operator can manipulate the load in the direction or about the axis, the second manual amount of force being less than the first manual amount of force.

* * * * *